(12) United States Patent
Bobok et al.

(10) Patent No.: US 7,912,694 B2
(45) Date of Patent: Mar. 22, 2011

(54) PRINT EVENTS IN THE SIMULATION OF A DIGITAL SYSTEM

(75) Inventors: Gabor Bobok, Niskayuna, NY (US); Wolfgang Roesner, Austin, TX (US); Derek E. Williams, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 706 days.

(21) Appl. No.: 11/668,542

(22) Filed: Jan. 30, 2007

(65) Prior Publication Data

US 2008/0183458 A1   Jul. 31, 2008

(51) Int. Cl.
   *G06F 17/50*   (2006.01)
   *G06F 9/455*   (2006.01)

(52) U.S. Cl. ............................... 703/16; 703/14; 703/15

(58) Field of Classification Search .................... 703/14, 703/17, 23–28; 364/578
   See application file for complete search history.

(56) References Cited

U.S. PATENT DOCUMENTS

| | | | |
|---|---|---|---|
| 5,212,650 | A | 5/1993 | Hooper et al. |
| 5,369,763 | A | 11/1994 | Biles |
| 5,604,895 | A | 2/1997 | Raimi |
| 5,852,564 | A * | 12/1998 | King et al. ....................... 703/14 |
| 6,117,181 | A | 9/2000 | Dearth et al. |
| 6,195,627 | B1 | 2/2001 | Bargh et al. |
| 6,195,629 | B1 * | 2/2001 | Bargh et al. ....................... 703/17 |
| 6,202,042 | B1 | 3/2001 | Bargh et al. |
| 6,285,914 | B1 | 9/2001 | Bae et al. |
| 6,345,242 | B1 | 2/2002 | Dearth et al. |
| 6,393,426 | B1 | 5/2002 | Odom et al. |
| 6,519,612 | B1 | 2/2003 | Howard et al. |
| 6,546,532 | B1 | 4/2003 | Kerzman et al. |
| 6,581,191 | B1 | 6/2003 | Schubert et al. |
| 6,618,839 | B1 | 9/2003 | Beardslee et al. |
| 6,668,364 | B2 | 12/2003 | McElvain et al. |
| 6,687,710 | B1 | 2/2004 | Dey |
| 6,720,565 | B2 | 4/2004 | Innes et al. |
| 6,751,583 | B1 | 6/2004 | Clarke et al. |
| 6,754,763 | B2 | 6/2004 | Lin |
| 2002/0019969 | A1 | 2/2002 | Hellestrand et al. |
| 2002/0032559 | A1 | 3/2002 | Hellestrand et al. |
| 2002/0049576 | A1 | 4/2002 | Meyer |
| 2002/0123874 | A1 | 9/2002 | Roesner et al. |
| 2002/0128809 | A1 | 9/2002 | Roesner et al. |
| 2002/0129333 | A1 | 9/2002 | Chandhoke et al. |

(Continued)

OTHER PUBLICATIONS

James Lee, "Verilog Quickstart a Practical Guide to Simulation and Synthesis in Verilog Third Edition", 2002, Kluwer Academic Publishers, pp. 47-60 and 109-124.*

*Primary Examiner* — Kamini S Shah
*Assistant Examiner* — Hung Havan
(74) *Attorney, Agent, or Firm* — Dillon & Yudell LLP

(57) ABSTRACT

According to a method of simulation processing, one or more HDL source files describing a digital design including a plurality of hierarchically arranged design entities are received. The one or more HDL source files include one or more statements instantiating a plurality of print events within the plurality of hierarchically arranged design entities, where each print event has an associated message and at least one associated signal in the digital design. The one or more HDL source files are processed to obtain a simulation executable model including a data structure describing the plurality of print events defined for the simulation executable model and associating each of the plurality of print events with its respective associated signal.

6 Claims, 21 Drawing Sheets

U.S. PATENT DOCUMENTS

| | | |
|---|---|---|
| 2002/0152060 A1 | 10/2002 | Tseng |
| 2003/0005416 A1 | 1/2003 | Henftling et al. |
| 2003/0035375 A1 | 2/2003 | Freeman |
| 2003/0037222 A1 | 2/2003 | Emberson et al. |
| 2003/0101039 A1 | 5/2003 | Gabele et al. |
| 2003/0121011 A1 | 6/2003 | Carter et al. |
| 2003/0144828 A1 | 7/2003 | Lin |
| 2003/0188299 A1 | 10/2003 | Broughton et al. |
| 2003/0192032 A1 | 10/2003 | Andrade et al. |
| 2005/0102125 A1 | 5/2005 | Tseng |
| 2005/0125754 A1 | 6/2005 | Schubert et al. |
| 2005/0137840 A1 | 6/2005 | Peck et al. |

* cited by examiner

```
ENTITY FXUCHK IS
    PORT(   S_IN    :   IN std_ulogic;
            Q_IN    :   IN std_ulogic;
            R_IN    :   IN std_ulogic;
            clock   :   IN std_ulogic;
            fails   :   OUT std_ulogic_vector(0 to 1);
            counts  :   OUT std_ulogic_vector(0 to 2);
        );
```
⎰ --!! BEGIN
452 ⎱ --!! Design Entity: FXU;

⎧ --!! Inputs
⎪ --!! S_IN    =>   B.C.S;
⎪ --!! Q_IN    =>   A.Q;
453 ⎨ --!! R_IN    =>   R;
⎪ --!! CLOCK   =>   clock;
⎩ --!! End Inputs ⎧ --!! Fail Outputs;
454 ⎨ --!! 0 : "Fail message for failure event 0";
⎪ --!! 1 : "Fail message for failure event 1";
⎩ --!! End Fail Outputs;

⎧ --!! Count Outputs;
⎪ --!! 0 : <event0> clock;
455 ⎨ --!! 1 : <event1> clock;
⎪ --!! 2 : <event2> clock;
⎩ --!! End Count Outputs;

⎧ --!! Print Events;
456 ⎨ --!! 0: valid1, "the op type is %2h", op_type(0 to 5);
⎪ --!! 1: a.b.valid2, "the left justified value is %<2h", a.b.xyz(0 to 5);
⎩ --!! End Print Events;

457 { --!! End;

ARCHITECTURE example of FXUCHK IS

BEGIN

... HDL code for entity body section ...   }458

END;

*Fig. 4C*

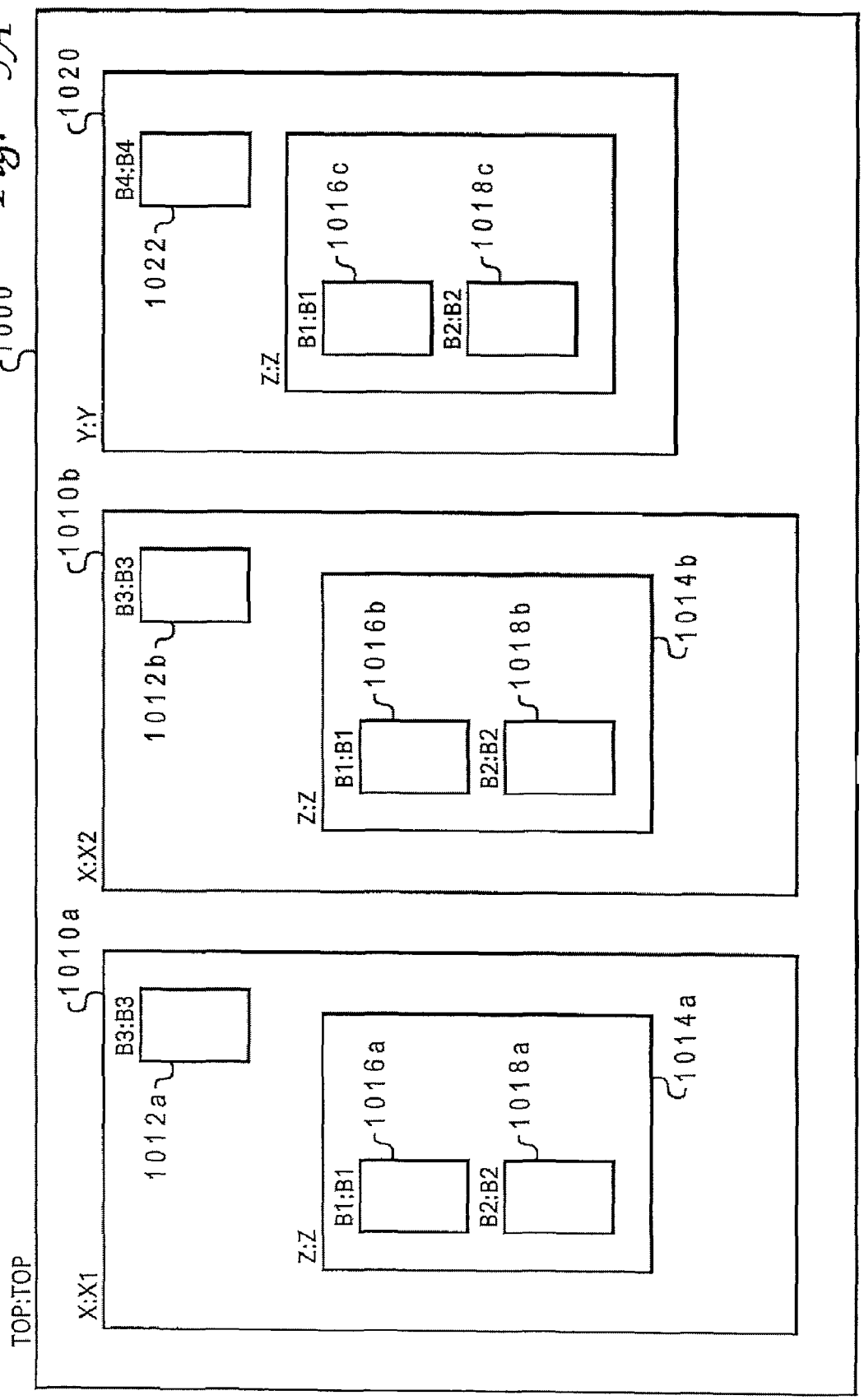

1030 <instantiation identifier>.<instrumentation entity name>.<design entity name>.<eventname> 1032 1034 1036

Fig. 5B

| 1030 | 1032 | 1034 | 1036 |
|------|------|------|------|
| X1 | B3 | X | COUNT1 |
| X1.Z | B1 | Z | COUNT1 |
| X1.Z | B2 | Z | COUNT1 |
| X2 | B3 | X | COUNT1 |
| X2.Z | B1 | Z | COUNT1 |
| X2.Z | B2 | Z | COUNT1 |
| Y | B4 | Y | COUNT1 |
| Y.Z | B1 | Z | COUNT1 |
| Y.Z | B2 | Z | COUNT1 |

1030 <instantiation identifier>.<design entity name>.<eventname> 1034 1036

Fig. 5D

```
ENTITY X IS

PORT(  :
           :
           :
        );

ARCHITECTURE example of X IS

BEGIN
    .
    .
    .
    ... HDL code for X ...
    .
    .
    .

1221 {  Y:Y
        PORT MAP(  :
                   :
                );

1222 {  A <= ....
        B <= ....
        C <= ....

1223 {  --!! [count, countname0, clock] <= Y.P;         /1230
        --!! Q <= Y. [B1.count.count1] AND A;   /1232
        --!! [fail, failname0, "fail msg"] <= Q XOR B;   /1234
        --!! [harvest, harvestname0, "harvest msg"] <= B AND C;   /1236
        --!! [print; pevent1; valid1; "Op type is %2h", op_type(0 to 5)];
        END;
                                                        \
                                                        1238
```
} 1220

| EN 802 | G/E 804 | Instance 806 | Name 808 | Message 810 | Pointer 812 | | | | |
|---|---|---|---|---|---|---|---|---|---|
| | E | 0 | Print1 | Signal X is %h | ● | ● | | | |
| | E | 0 | Print2 | Request activated | ● | | | | |
| | G | 0 | Print_Group1 | 0 | ● | ● | | | |
| | G | 0 | Print_group2 | 0 | ● | ● | ● | ● | ● |
| | E | FXU_Inst1 | pevent1 | Op_type is %b | ● | ● | | | |
| | E | FXU_inst1 | pevent2 | Signal xyz is %2h | ● | ● | | | |
| | E | FXU_inst1 | pevent1 | Op_type is %b | ● | ● | | | |
| | E | FXU_inst1 | pevent2 | Signal xyz is %2h | ● | ● | | | |

800 brackets the first row.

*Fig. 8*

PRINT EVENTS IN THE SIMULATION OF A DIGITAL SYSTEM

CROSS-REFERENCE TO RELATED APPLICATION

The present application is related to U.S. patent application Ser. No. 11/006,093, which is incorporated herein by reference in its entirety.

BACKGROUND OF THE INVENTION

1. Technical Field

The present invention relates in general to designing and simulating digital devices, modules and systems, and in particular, to a method and system for computer simulation of digital devices, modules and systems utilizing a hardware description language (HDL) model. More particularly, the present invention relates to methods, systems, and program products supporting print events in a simulation.

2. Description of the Related Art

Verifying the logical correctness of a digital design and debugging the design, if necessary, are very important steps in most digital design processes. Logic networks are tested either by actually building networks or by simulating networks on a computer. As logic networks become highly complex, it becomes necessary to simulate a design before the design is actually built. This is especially true when the design is implemented as an integrated circuit, since the fabrication of integrated circuits requires considerable time and correction of mistakes is quite costly. The goal of digital design simulation is the verification of the logical correctness of the design.

In a typical automated design process that is supported by a conventional electronic computer-aided design (ECAD) system, a designer enters a high-level description utilizing a hardware description language (HDL), such as VHDL, producing a representation of the various circuit blocks and their interconnections. The ECAD system compiles the design description into a format that is best suited for simulation. A simulator is then utilized to verify the logical correctness of the design prior to developing a circuit layout.

A simulator is typically a software tool that operates on a digital representation, or simulation model of a circuit, and a list of input stimuli (i.e., testcase) representing inputs of the digital system. A simulator generates a numerical representation of the response of the circuit, which may then either be viewed on the display screen as a list of values or further interpreted, often by a separate software program, and presented on the display screen in graphical form. The simulator may be run either on a general-purpose computer or on another piece of electronic apparatus, typically attached to a general purpose computer, specially designed for simulation. Simulators that run entirely in software on a general-purpose computer will hereinafter be referred to as "software simulators". Simulators that are run with the assistance of specially designed electronic apparatus will hereinafter be referred to as "hardware simulators".

Usually, software simulators perform a very large number of calculations and operate slowly from the user's point of view. In order to optimize performance, the format of the simulation model is designed for very efficient use by the simulator. Hardware simulators, by nature, require that the simulation model comprising the circuit description be communicated in a specially designed format. In either case, a translation from an HDL description to a simulation format, hereinafter referred to as a simulation executable model, is required.

The result of the application of the testcase to the simulation executable model by the simulator is referred to herein as an "all events trace" (AET). The AET contains the logic values of signals and/or storage elements within the simulation executable model for each simulation cycle. An AET viewer can be utilized to present by the contents of the AET to the user for review and analysis, for example, to assist the user in detecting and determining the cause of errors in the design. As will be appreciated, the AET typically presents signal and latch values of interest on a cycle-by-cycle basis. Thus, to analyze the simulation results, the user must manually comb through the AET to identifying the particular cycle(s) of interest and then interpret the raw signal or latch values without the aid of explanatory text. This conventional method of simulation result analysis is improved upon by the present invention.

SUMMARY OF THE INVENTION

According to a method of simulation processing, one or more HDL source files describing a digital design including a plurality of hierarchically arranged design entities are received. The one or more HDL source files include one or more statements instantiating a plurality of print events within the plurality of hierarchically arranged design entities, where each print event has an associated message and at least one associated signal in the digital design. The one or more HDL source files are processed to obtain a simulation executable model including a data structure describing the plurality of print events defined for the simulation executable model and associating each of the plurality of print events with its respective associated signal.

All objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 4C illustrates exemplary sections of HDL syntax that may be utilized in accordance with the teachings of the present invention;

FIG. 5A is a block diagram illustrating a simulation model containing a number of design and instrumentation entities;

FIG. 5B depicts a data structure for declaring an event within a simulation model in accordance with one embodiment of the present invention;

FIG. 5C illustrates a list of extended event data structures for the simulation model in FIG. 5A;

FIG. 5D depicts a data structure for declaring an event within a simulation model in accordance with an alternate embodiment of the present invention;

FIG. 6B illustrates an exemplary HDL file for implementing instrumentation logic within an HDL design entity in accordance with the teachings of the present invention;

FIG. 8 is a block diagram of a print event table corresponding to the simulation model of FIG. 7;

DETAILED DESCRIPTION OF A PREFERRED EMBODIMENT

The present invention provides for accurate and comprehensive monitoring of a digital circuit design in which a designer creates instrumentation modules utilizing similar hardware description language (HDL) syntax as that utilized for the design itself. HDLs, while suited to the needs of digital designers can also be effectively utilized for a number of checking functions. In accordance with the method and system of the present invention, instrumentation modules are utilized to monitor specified design parameters while not becoming compiled as an integral part of the design itself. Furthermore, since the instrumentation modules are specified utilizing an HDL similar to that utilized to describe the actual design, such modules are platform and simulator independent. Unlike checking performed with C or C++ programs, HDL instrumentation can be compiled and run directly without loss of performance on hardware simulators.

Figure 1:
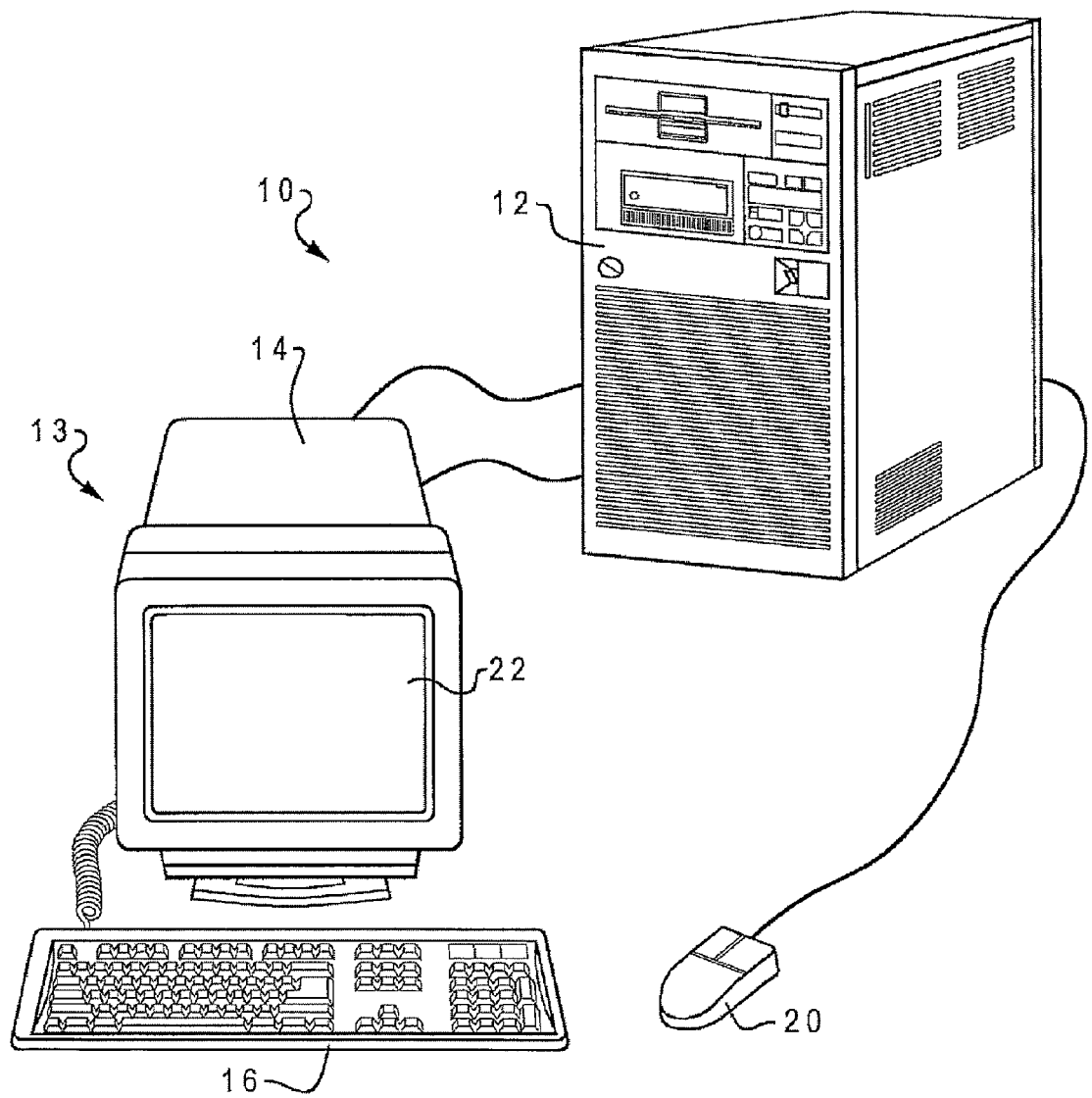
FIG. 1 is a pictorial representation of an exemplary data processing system.

With reference now to the figures, and in particular with reference to FIG. 1, there is depicted a pictorial representation of an exemplary data processing system 10 with which the present invention may be advantageously utilized. As illustrated, data processing system 10 comprises a server (or workstation) 12 to which one or more nodes 13 are connected. Server/workstation 12 preferably comprises a high performance multiprocessor computer, such as one of the POWER line of computer systems available from International Business Machines (IBM) Corporation of Armonk, N.Y. Server/workstation 12 preferably includes nonvolatile and volatile internal storage for storing software program code comprising an ECAD system, which can be utilized to develop and verify a digital circuit design in accordance with the present invention. As depicted, nodes 13 comprise at least a display device 14, a keyboard 16, and a mouse 20, and may further provide additional processing resources. The ECAD program code executed within workstation 12 preferably display a graphic user interface (GUI) within display screen 22 of display device 14 with which a digital circuit designer can interact using a keyboard 16 and mouse 20. Thus, by entering appropriate inputs utilizing keyboard 16 and mouse 20, the digital circuit designer is able to develop and verify a digital circuit design as described further hereinbelow.

Figure 2:
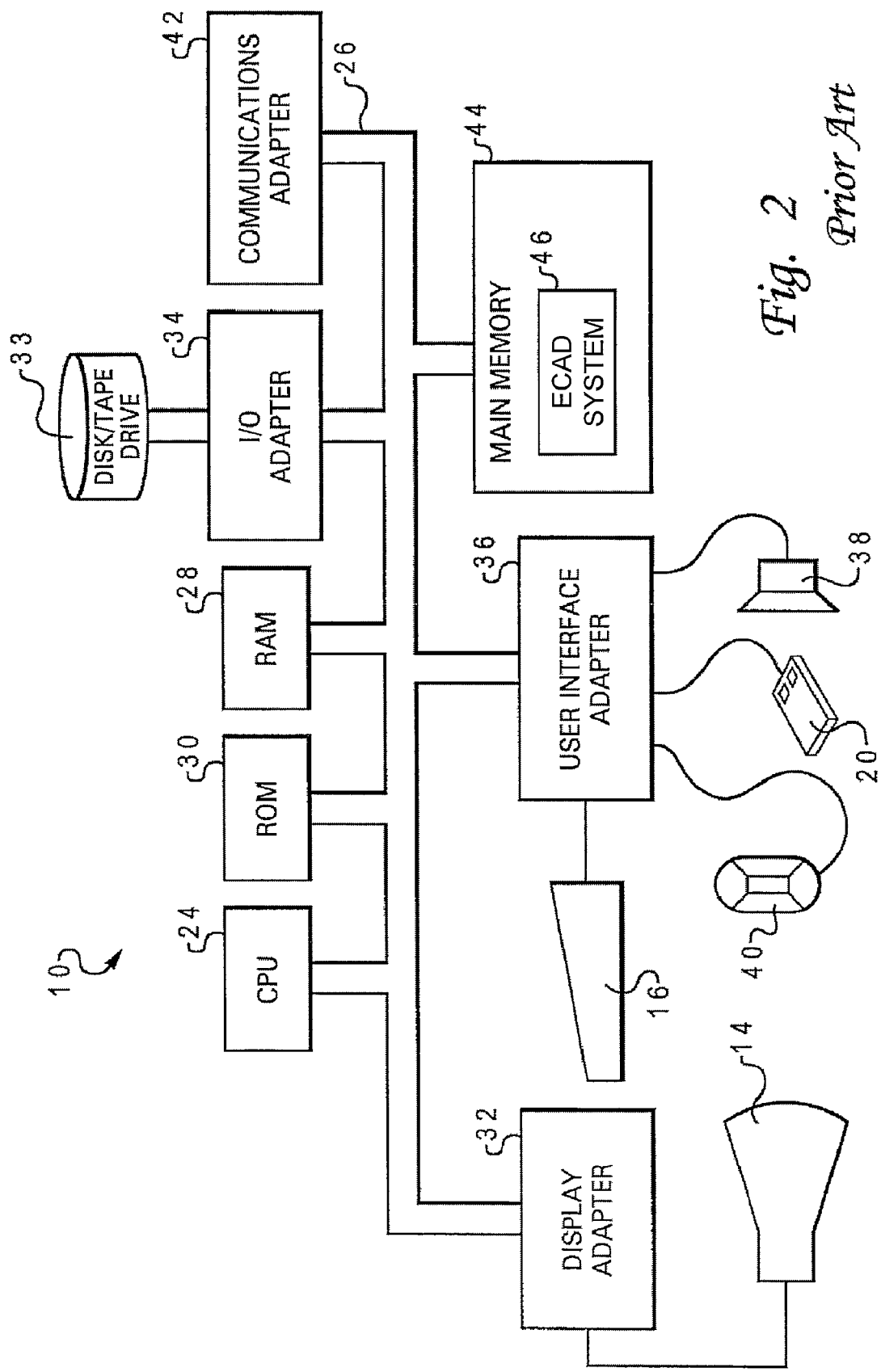
FIG. 2 depicts a representative hardware environment of the data processing system illustrated in FIG. 1.

FIG. 2 depicts a representative hardware environment of exemplary data processing system 10 of FIG. 1. Data processing system 10 is configured to include all functional hardware and software components of a computer system. Data processing system 10 includes one or more Central Processing Units (CPUs) 24, such as a conventional microprocessor, and a number of other components interconnected via system bus 26. CPU 24 controls the operation of the entire computer system, including performing the arithmetical and logical functions indicated by computer programs. Although not depicted in FIG. 2, CPUs such as CPU 24 typically include a control unit that organizes data and program storage in a computer memory and transfers the data and other information between the various parts of the computer system. Such CPUs also generally include an arithmetic unit that executes the arithmetical and logical operations, such as addition, comparison, multiplications and so forth. Such components and units of data processing system 10 can be implemented in server/workstation 12 of FIG. 1.

Data processing system 10 further includes a main (or system memory) 44, optional additional random-access memory (RAM) 28, read-only memory (ROM) 30, a display adapter 32 for connecting system bus 26 to display device 14 (e.g., a CRT or LCD flat-panel display), and an I/O adapter 34 for connecting peripheral devices (e.g., disk and tape drives 33) to system bus 26.

Data processing system 10 further includes user interface adapter 36 for connecting keyboard 16, mouse 20, speaker 38, microphone 40, and/or other user interface devices to system bus 26. A communications adapter 42 coupled to system bus 26 connects data processing system 10 to an external computer network (e.g., a local area network (LAN) or wide area network (WAN)).

Data processing system 10 also includes an operating system (e.g., Microsoft Windows, AIX or Linux) that resides within a machine-readable media to direct the operation of data processing system 10. Any suitable machine-readable media may retain the operating system, such as main memory 44, RAM 28, ROM 30, a magnetic disk, magnetic tape, or optical disk (the last three being located in disk and tape drives 33). A computer readable medium, such as main memory 44, further includes ECAD system 46 that, when processed by CPU 24, carries out the operations described herein.

Those skilled in the art will appreciate that the hardware depicted in FIG. 2 may vary for specific design and simulation applications. For example, other peripheral devices such as optical disk media, audio adapters, or chip programming devices, such as PAL or EPROM programming devices well-known in the art of computer hardware and the like, may be utilized in addition to or in place of the depicted hardware. In addition, although FIG. 2 only depicts a single CPU and a single system bus within data processing system 10, it should be understood that the present invention is not limited to the generalized system architecture shown in FIGS. 1 and 2 and that the present invention applies equally to computer systems that multiple CPUs and/or a more complex interconnect architecture.

Figure 3A:
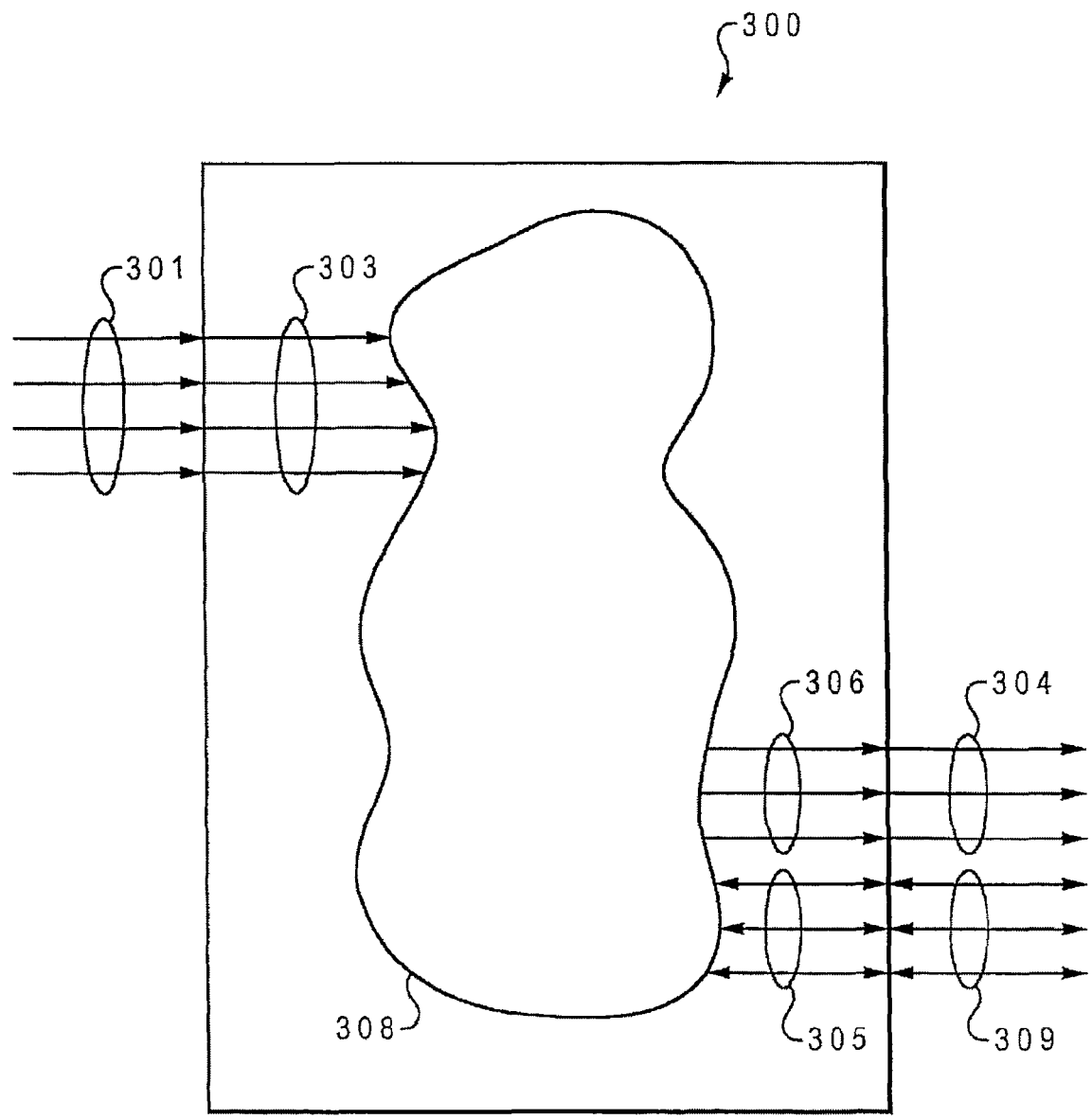
FIG. 3A is a simplified block diagram illustrating a digital design entity that may be instrumented in accordance with the teachings of the present invention.

Simulated digital circuit design models are comprised of at least one and usually many sub-units referred to hereinafter as design entities. FIG. 3A is a block diagram representation of an exemplary design entity 300 in which the method and system of the present invention may be implemented. Design entity 300 is defined by a number of components: an entity name, entity ports, and a representation of the function performed by design entity 300. Each entity within a given model has a unique name (not explicitly shown in FIG. 3A) that is declared in the HDL description of each entity. Furthermore, each entity typically contains a number of signal interconnections, known as ports, to signals outside the entity. These outside signals may be primary input/outputs (I/Os) of an overall design or signals connecting to other entities within an overall design.

Typically, ports are categorized as belonging to one of three distinct types: input ports, output ports, and bi-directional ports. Design entity 300 is depicted as having a number of input ports 303 that convey signals into design entity 300. Input ports 303 are connected to input signals 301. In addition, design entity 300 includes a number of output ports 306 that convey signals out of design entity 300. Output ports 306 are connected to a set of output signals 304. Bi-directional ports 305 are utilized to convey signals into and out of design entity 300. Bi-directional ports 305 are in turn connected to a set of bi-directional signals 309. An entity, such as design entity 300, need not contain ports of all three types, and in the degenerate case, contains no ports at all. To accomplish the connection of entity ports to external signals, a mapping technique, known as a "port map", is utilized. A port map (not explicitly depicted in FIG. 3A) consists of a specified correspondence between entity port names and external signals to which the entity is connected. When building a simulation model, ECAD software is utilized to connect external signals to appropriate ports of the entity according to a port map specification.

Finally, design entity 300 contains a body section 308 that describes one or more functions performed by design entity 300. In the case of a digital design, body section 308 contains an interconnection of logic gates, storage elements, etc., in addition to instantiations of other entities. By instantiating an entity within another entity, a hierarchical description of an overall design is achieved. For example, a microprocessor may contain multiple instances of an identical functional unit. As such, the microprocessor itself will often be modeled as a single entity. Within the microprocessor entity, multiple instantiations of any duplicated functional entities will be present.

Figure 3B:
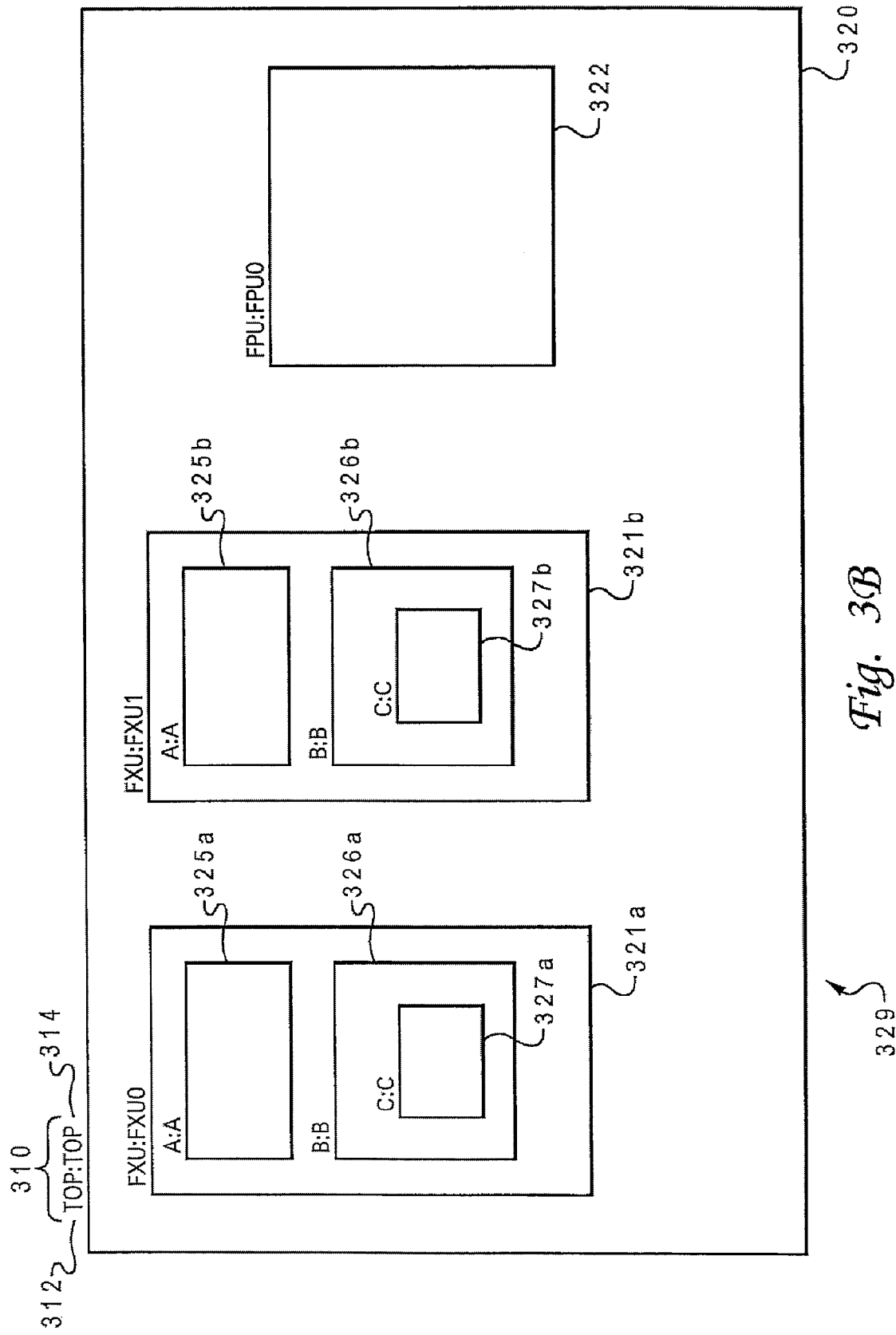
FIG. 3B is a diagrammatic representation depicting a simulation model that may be instrumented in accordance with the teachings of the present invention.

Referring now to FIG. 3B, there is illustrated a diagrammatic representation of an exemplary simulation model 329 that may be utilized in a preferred embodiment of the present invention. Simulation model 329 consists of multiple hierarchical entities. For visual simplicity and clarity, the ports and signals interconnecting the entities within simulation model 329 have not been explicitly shown. In any model, one and only one entity is the so-called "top-level entity". A top-level entity 320 is that entity which encompasses all other entities within simulation model 329. That is to say, top-level entity 320 instantiates, either directly or indirectly, all descendant entities within a design. Simulation model 329 consists of top-level entity 320 which directly instantiates two instances, 321a and 321b, of an FXU entity 321 and a single instance of an FPU entity 322. Each instantiation has an associated description, which contains an entity name and a unique instantiation name. For top-level entity 320, description 310 is labeled "TOP:TOP". Description 310 includes an entity name 312, labeled as the "TOP" preceding the colon, and also includes an instantiation name 314, labeled as the "TOP" following the colon.

It is possible for a particular entity to be instantiated multiple times as is depicted with instantiations 321a and 321b of FXU entity 321. Instantiations 321a and 321b are distinct instantiations of FXU entity 321 with instantiation names FXU0 and FXU1 respectively. Top-level entity 320 is at the highest level within the hierarchy of simulation model 329. An entity that instantiates a descendant entity will be referred to hereinafter as an "ancestor" of the descendant entity. Top-level entity 320 is therefore the ancestor that directly instantiates FXU entity instantiations 321a and 321b. At any given level of a simulation model hierarchy, the instantiation names of all instantiations must be unique.

In addition to FXU entity instantiations 321a and 321b, top-level entity 320 directly instantiates a single instance of a FPU entity 322 having an entity name FPU and instantiation name FPU0. Within an entity description, it is common for the entity name to match the instantiation name when only one instance of that particular entity is placed at a given level of a simulation model hierarchy. However, this is not required as shown by entity 322 (instantiation name FPU0, entity name FPU).

Within instantiation 321a of FXU entity 321, single instance entities 325a and 326a of entity A 325 and entity B 326 respectively, are directly instantiated. Similarly, instantiation 321b of the same FXU entity contains instantiations 325b and 326b of entity A 325 and entity B 326 respectively. In a similar manner, instantiation 326a and instantiation 326b each directly instantiate a single instance of entity C 327 as entities 327a and 327b respectively. The nesting of entities within other entities can continue to an arbitrary level of complexity provided that all entities instantiated, whether singly or multiply, have unique entity names and the instantiation names at any given level of the hierarchy are unique with respect to one another. Each entity is constructed from one or more HDL files that contain the information necessary to describe the entity.

Associated with each entity instantiation is a so called "instantiation identifier". The instantiation identifier for a given instantiation is a string consisting of the enclosing entity instantiation names proceeding from the top-level entity instantiation name. For example, the instantiation identifier of instantiation 327a of entity C 327 within instantiation 321a of FXU entity 321 is "TOP.FXU0.B.C". This identifier serves to uniquely identify each instantiation within a simulation model.

Figure 3C:
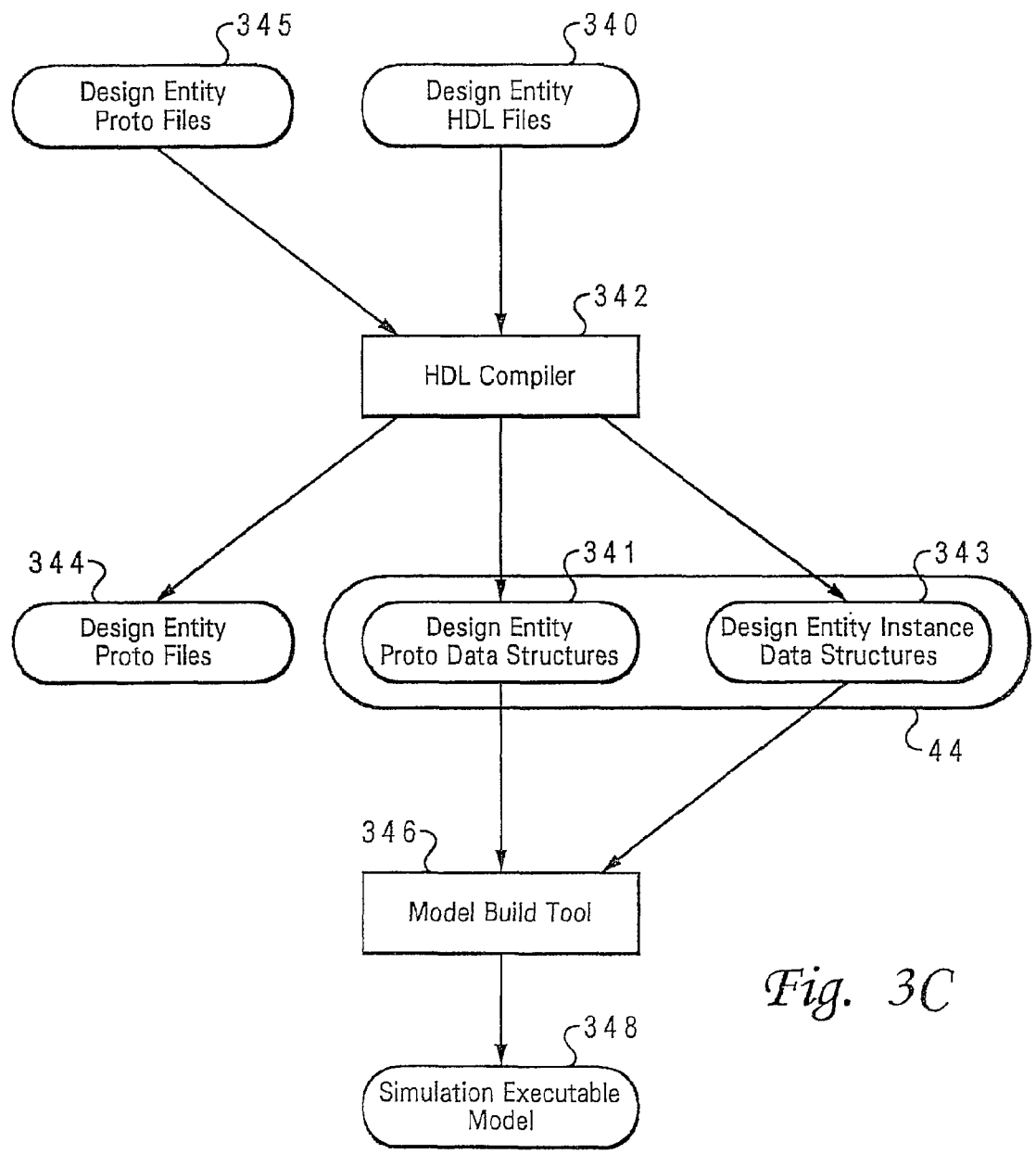
FIG. 3C is a flow diagram illustrating a model build process that may be implemented in accordance with the teachings of the present invention.

Referring now to FIG. 3C, there is depicted a flow diagram of a model build process which may be implemented in a preferred embodiment of the present invention. The process begins with one or more design entity HDL source code files 340 and, potentially, one or more design entity intermediate format files 345, hereinafter referred to as "proto files" 345, available from a previous run of an HDL compiler 342. HDL compiler 342 processes HDL file(s) 340 beginning with the top level entity of a simulation model and proceeding in a recursive fashion through all HDL or proto file(s) describing a complete simulation model. For each of HDL files 340 during the compilation process, HDL compiler 342 examines proto files 345 to determine if a previously compiled proto file is available and consistent. If such a file is available and consistent, HDL compiler 342 will not recompile that particular file, but will rather refer to an extant proto file. If no such proto file is available or the proto file is not consistent, HDL compiler 342 explicitly recompiles the HDL file 340 in question and creates a proto file 344 for use in subsequent compilations. Such a process will be referred to hereinafter as "incremental compilation" and can greatly speed the process of creating a simulation executable model 348. Once created by HDL compiler 342, proto files 344 are available to serve as proto files 345 in subsequent compilations.

In addition to proto files 344, HDL compiler 342 also creates two sets of data structures, design entity proto data structures 341 and design entity instance data structures 343, in memory 44 of computer system 10. Design entity proto data structures 341 and design entity instance data structures 343, serve as a memory image of the contents of a simulation executable model 348. Data structures 341 and 343 are passed, via memory 44, to a model build tool 346 that processes data structures 341 and 343 into simulation executable model 348.

It will be assumed hereinafter that each entity is described by a single HDL file. Depending on convention or the particular HDL in which the current invention is practiced, this restriction may be required. However, in certain circumstances or for certain HDLs it is possible to describe an entity by utilizing more than one HDL file. Those skilled in the art will appreciate and understand the extensions necessary to practice the present invention if entities are permitted to be described by multiple HDL files. Furthermore, it will be assumed that there is a direct correspondence, for each entity, between the entity name and both of the following: the name of the HDL file representing the entity, and the name of the proto file for the entity.

In the following description, an HDL source code file corresponding to a given entity will be referred to by an entity name followed by ".vhdl". For example, the HDL source code file that describes top-level entity 320 will be referred to as TOP.vhdl. This labeling convention serves as a notational convenience only and should not be construed as limiting the applicability of the present invention to HDLs other than VHDL.

Returning to FIG. 3B, it can be seen that each entity may instantiate, either directly or indirectly, one or more other entities. For example, the FXU entity directly instantiates A entity 325 and B entity 326. Furthermore, B entity 326 directly instantiates C entity 327. Therefore, FXU entity 321 instantiates, directly or indirectly, A entity 325, B entity 326 and C entity 327. Those entities, that are directly or indirectly instantiated by another entity, will be referred to hereinafter as "descendants". The descendants of top level entity 320 are FXU entity 321, A entity 325, B entity 326, and C entity 327. It can be seen that each entity has a unique set of descendants and that each time an entity is instantiated, a unique instance of the entity and its descendants is created. Within simulation model 329, FXU entity 321 is instantiated twice, FXU:FXU0 321a and FXU:FXU1 321b, by top-level entity 320. Each instantiation of FXU entity 321 creates a unique set of instances of the FXU, A, B, and C entities.

For each entity, it is possible to define what is referred to as a "bill-of-materials" or BOM. A BOM is a list of HDL files having date and time stamps of the entity itself and the entity's descendants. Referring again to FIG. 3C, the BOM for an entity is stored in proto file 344 after compilation of the entity. Therefore, when HDL compiler 342 compiles a particular HDL source code file among HDL files 340, a proto file 344 is generated that includes a BOM listing the HDL files 340 that constitute the entity and the entity's descendants, if any. The BOM also contains the date and time stamp for each of the HDL files referenced as each appeared on disk/tape 33 of computer system 10 when the HDL file was being compiled.

If any of the HDL files constituting an entity or the entity's descendants is subsequently changed, proto file 344 will be flagged as inconsistent and HDL compiler 342 will recompile HDL file 340 on a subsequent re-compilation as will be described in further detail below. For example, going back to FIG. 3B, the HDL files referenced by the BOM of FXU entity 321 are FXU.vhdl, A.vhdl, B.vhdl and C.vhdl, each with appropriate date and time stamps. The files referenced by the BOM of top-level entity 320 are TOP.vhdl, FXU.vhdl, A.vhdl, B.vhdl, C.vhdl, and FPU.vhdl with appropriate date and time stamps.

Returning to FIG. 3C, HDL compiler 342 creates an image of the structure of a simulation model in main memory 44 of computer system 10. This memory image is comprised of the following components: "proto" data structures 341 and "instance" data structures 343. A proto is a data structure that, for each entity in the model, contains information about the ports of the entity, the body contents of the entity, and a list of references to other entities directly instantiated by the entity (in what follows, the term "proto" will be utilized to refer to the in-memory data structure described above and the term "proto file" will be utilized to describe intermediate format file(s) 344). Proto files 344 are therefore on-disk representations of the in-memory proto data structure produced by HDL compiler 342.

An instance data structure is a data structure that, for each instance of an entity within a model, contains the instance name for the instance, the name of the entity the instance refers to, and the port map information necessary to interconnect the entity with external signals. During compilation, each entity will have only one proto data structure, while, in the case of multiple instantiations of an entity, each entity may have one or more instance data structures.

In order to incrementally compile a model efficiently, HDL compiler 342 follows a recursive method of compilation in which successive entities of the model are considered and loaded from proto files 345 if such files are available and are consistent with the HDL source files constituting those entities and their descendants. For each entity that cannot be loaded from existing proto files 345, HDL compiler 342 recursively examines the descendants of the entity, loads those descendant entities available from proto file(s) 345 and creates, as needed, proto files 344 for those descendants that are inconsistent with proto files 345. Pseudocode for the main control loop of HDL compiler 342 is shown below (the line numbers to the right of the pseudocode are not a part of the pseudocode, but merely serve as a notational convenience).

```
process_HDL_file(file)                                        5
{                                                            10
    if (NOT proto_loaded(file)) {                            15
        if (exists_proto_file(file) AND check_bom(file)) {   20
            load_proto(file);                                25
        } else {                                             30
            parse_HDL_file(file)                             35
            for (all instances in file) {                    40
                process_HDL_file(instance);                  45
```

```
        }                                      50
            create_proto(file);                55
            write_proto_file(file);            60
        }                                      65
    }                                          70
        create_instance(file):                 75
    }                                          80
```

When compiler 342 is initially invoked, no proto data structures 341 or instance data structures 343 are present in memory 44 of computer system 10. The main control loop, routine process_HDL_file( ) (line 5), is invoked and passed the name of the top level entity by means of parameter "file". The algorithm first determines if a proto data structure for the current entity is present in memory 44 by means of routine proto_loaded( ) (line 15). Note that the proto data structure for the top level entity will never be present in memory because the process starts without any proto data structures loaded into memory 44. If a matching proto data structure is present in memory 44, instance data structures for the current entity and the current entity's descendants, if any, are created as necessary in memory 44 by routine create_instance( ) (line 75).

However, if a matching proto data structure is not present in memory 44, control passes to line 20 where routine exists_proto_file( ) examines proto files 345 to determine if a proto file exists for the entity. If and only if a matching proto file exists, routine check_bom( ) is called to determine whether proto file 345 is consistent. In order to determine whether the proto file is consistent, the BOM for the proto file is examined. Routine check_bom( ) examines each HDL source code file listed in the BOM to determine if the date or time stamps for the HDL source code file have changed or if the HDL source code file has been deleted. If either condition occurs for any file in the BOM, the proto file is inconsistent and routine check_bom( ) fails. However, if check_bom( ) is successful, control is passed to line 25 where routine load_proto( ) loads the proto file and any descendant proto files into memory 44, thus creating proto data structures 341 for the current entity and the current entity's descendants, if any. The construction of process_HDL_file( ) ensures that once a proto file has been verified as consistent, all of its descendant proto files, if any, are also consistent.

If the proto file is either non-existent or is not consistent, control passes to line 35 where routine parse_HDL_file( ) loads the HDL source code file for the current entity. Routine parse_HDL_file( ) (line 35) examines the HDL source code file for syntactic correctness and determines which descendant entities, if any, are instantiated by the current entity. Lines 40, 45, and 50 constitute a loop in which the routine process_HDL_file( ) is recursively called to process the descendent entities that are called by the current entity. This process repeats recursively traversing all the descendants of the current entity in a depth-first fashion creating proto data structures 341 and proto data files 344 of all descendants of the current entity. Once the descendant entities are processed, control passes to line 55 where a new proto data structure is created for the current entity in memory 44 by routine create_proto( ). Control then passes to line 60 where a new proto file 344, including an associated BOM, is written to disk 33 by routine write_proto_file( ). Finally, control passes to line 75 where routine create_instance( ) creates instance data structures 343 for the current entity and any descendant entities as necessary. In this manner, process_HDL_file( ) (line 5) recursively processes the entire simulation model creating an in-memory image of the model consisting of proto data structures 341 and instance data structures 343.

Figure 3D:
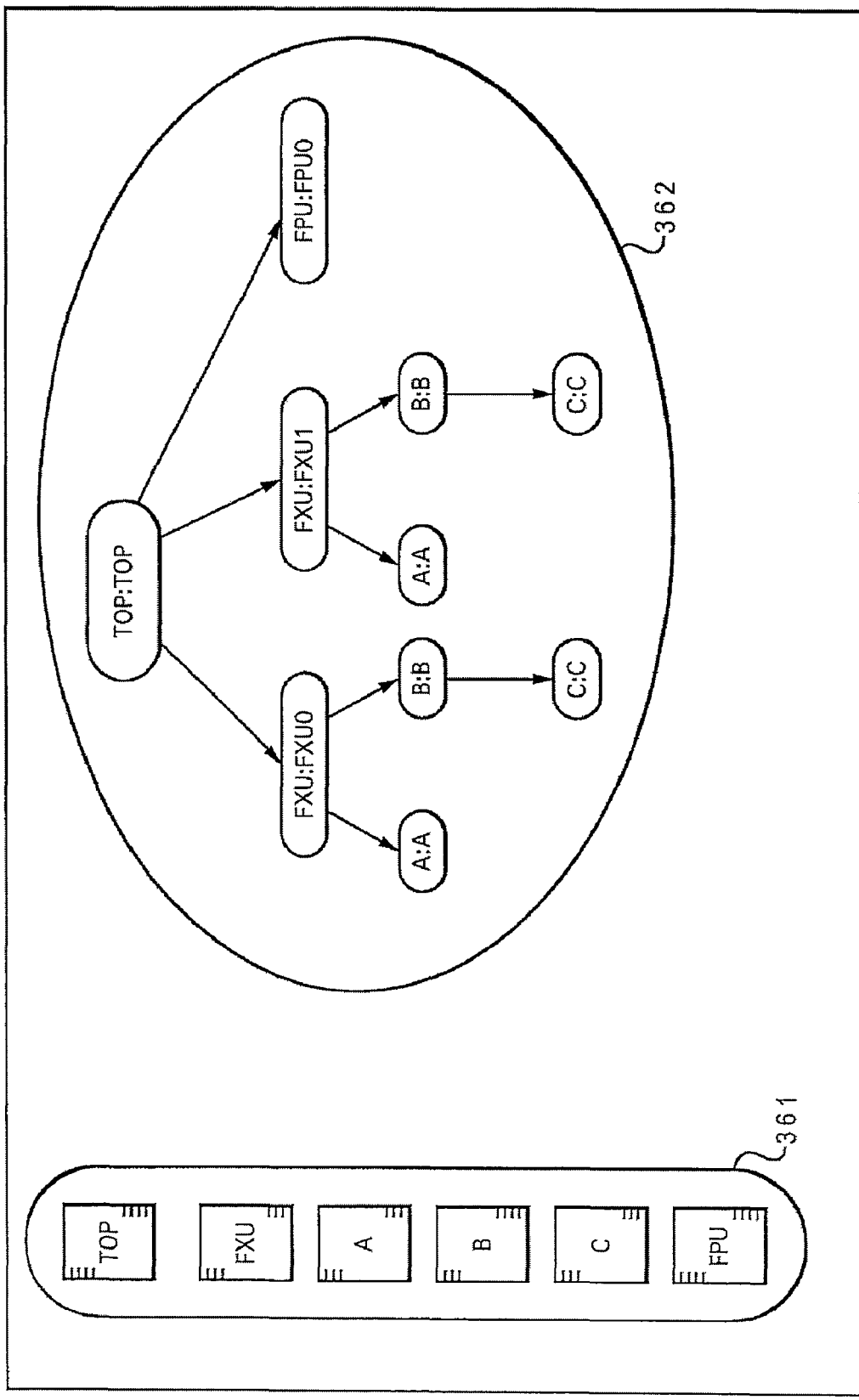
FIG. 3D is a block diagram depicting data structures that may be instrumented in accordance with the teachings of the present invention.

With reference now to FIG. 3D there is depicted a block diagram representing compiled data structures, which may be implemented in a preferred embodiment of the present invention. Memory 44 contains proto data structures 361, one for each of the entities referred to in simulation model 329. In addition, instantiations in simulation model 329 are represented by instance data structures 362. Instance data structures 362 are connected by means of pointers indicating the hierarchical nature of the instantiations of the entities within simulation model 329. Model build tool 346 in FIG. 3C processes the contents of memory 44 into memory data structures in order to produce simulation executable model 348.

In order to instrument simulation models, the present invention makes use of entities known as "instrumentation entities," which are in contrast to the entities constituting a design which are referred to herein as "design entities". As with design entities, instrumentation entities are described by one or more HDL source code files and consist of a number of signal ports, a body section, and an entity name. In what follows, it will be assumed that an instrumentation entity is described by a single HDL file. Those skilled in the art will appreciate and understand extensions necessary to practice the current invention for an instrumentation entity that is described by multiple HDL files. Each instrumentation entity is associated with a specific design entity referred to hereinafter as the "target entity".

Figure 4A:
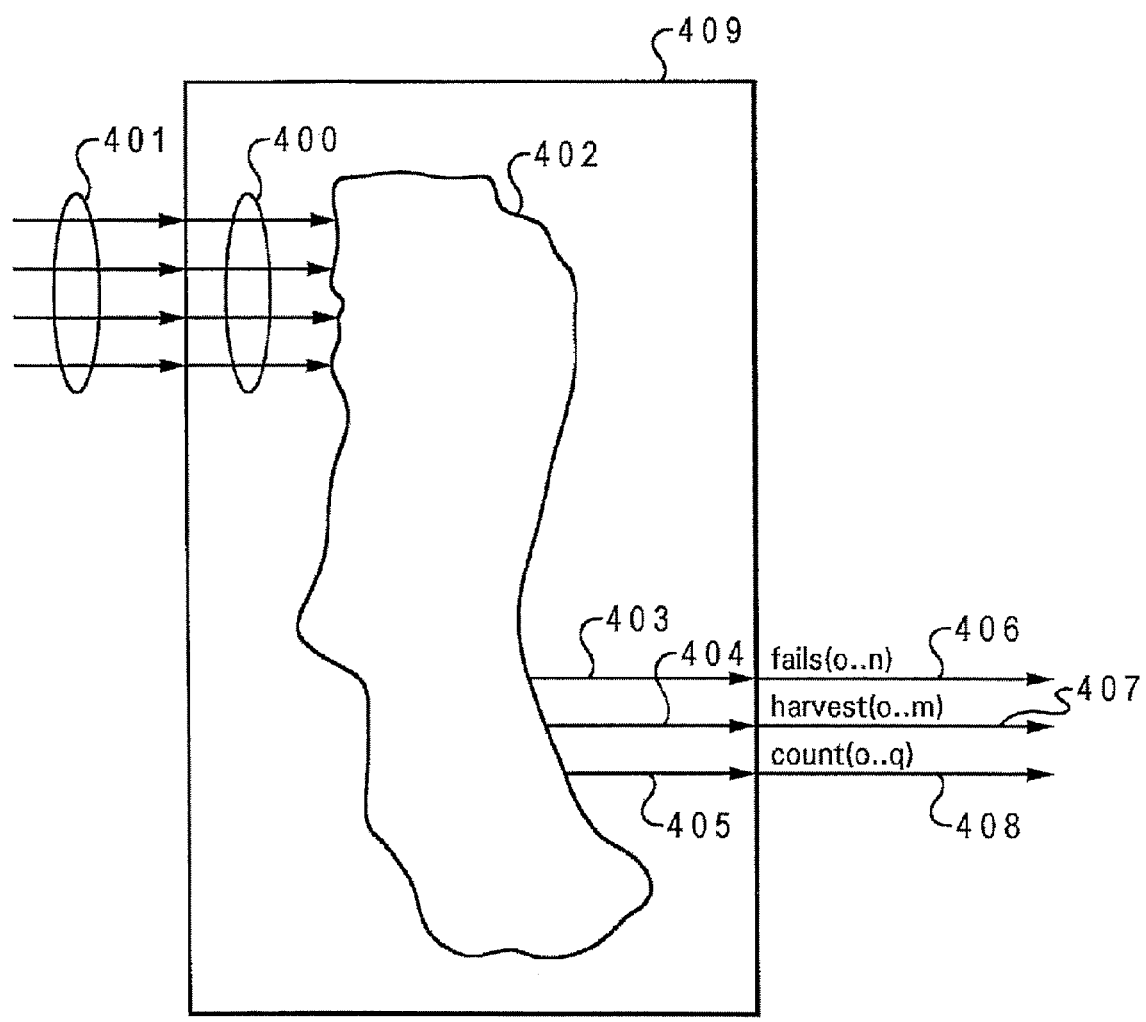
FIG. 4A is a simplified block diagram representative of an instrumentation entity.

With reference now to FIG. 4A, there is illustrated a block diagram representation of an instrumentation entity 409. Instrumentation entity 409 includes a number of input ports 400 that are connected to signals 401 within a target entity (not depicted in FIG. 4A). A body section 402 contains logic necessary to detect occurrences of specified conditions within the target entity and generate simulation model "events" with respect to signals 401. At least four distinct types of events may be generated: "count" events, "fail" events, "harvest" events, and "print" events, each described below in turn. Body section 402 contains internal logic for detecting occurrences of conditions precipitating generation of these events. A set of multi-bit output ports 403, 404, and 405 are connected to external instrumentation logic 420 (depicted in FIG. 4B) by means of external signals 406, 407, and 408. Output ports 403, 404, and 405 thus provide the connection from the internal logic in body section 402 to the external instrumentation logic 420, which is utilized to indicate the occurrence of count, failure, and harvest events.

A failure event is a sequence of signal values that indicate a failure in the correct operation of the simulation model. Each instrumentation entity monitors the target entity for any desired number of failure events. Each occurrence of a failure event is assigned to a particular signal bit on output port 403. Logic within body section 402 produces an active high pulse on a specified bit of signal 403 when a failure condition is detected. Such activation of signal 403 is defined as a failure event. This error indication is conveyed by means of external signal 406 to external instrumentation logic (depicted in FIG. 4B as external instrumentation logic block 420), which flags the occurrence of the failure event.

A count event is a sequence of signal values that indicate the occurrence of an event within a simulation model for which it would be advantageous to maintain a count. Count events are utilized to monitor the frequency of occurrence of specific sequences within a simulation model. Each instrumentation entity can monitor the target entity for any desired number of count events. Each count event is assigned to a particular signal bit on output port 405. Logic block 402 contains the logic necessary to detect the occurrence of the desired count events and produces an active high pulse on the specified bit of signal 405 when a count event is detected. This count indication is conveyed by means of external signal 408 to instrumentation logic, which contains counters utilized to record the number of occurrences of each count event.

The third event type, a harvest event, is a sequence of signal values that indicate the occurrence of a specific operative circumstance, which would be advantageous to be able to reproduce. When a harvest event occurs, a register within an external instrumentation logic block is loaded to indicate at what point within a simulation run the event occurred, and a flag is set to indicate the occurrence of the specific circumstance. The details of the simulation run can thus be saved in order to recreate the specific circumstance monitored by the harvest event. Logic block 402 contains the logic necessary to detect the harvest events.

Each instrumentation entity can detect any desired number of harvest events that are each assigned to a particular signal bit on output port 404. Logic within block 402 produces an active high pulse on the specified bit of signal 404 when a harvest event is detected. This harvest event detection is conveyed by means of external signal 407 to external instrumentation logic that contains a register and flag for each harvest event. The register is utilized to record at which point in the simulation run the harvest event occurred, and the flag is utilized to indicate the occurrence.

The fourth event type, a print event, is a sequence of signal values that indicate the occurrence of an event within a simulation model that it would be advantageous to present in the results of a simulation run. Print events are thus utilized to present for subsequent review and analysis signal values of interest within a simulation model. Each instrumentation entity can monitor the target entity for any desired number of print events. Unlike the other event types, print events are not assigned an output port of an instrumentation entity like output ports 403-405 described above. Instead, print events are detected and recorded by external instrumentation logic block 420, as discussed further below.

Figure 4B:
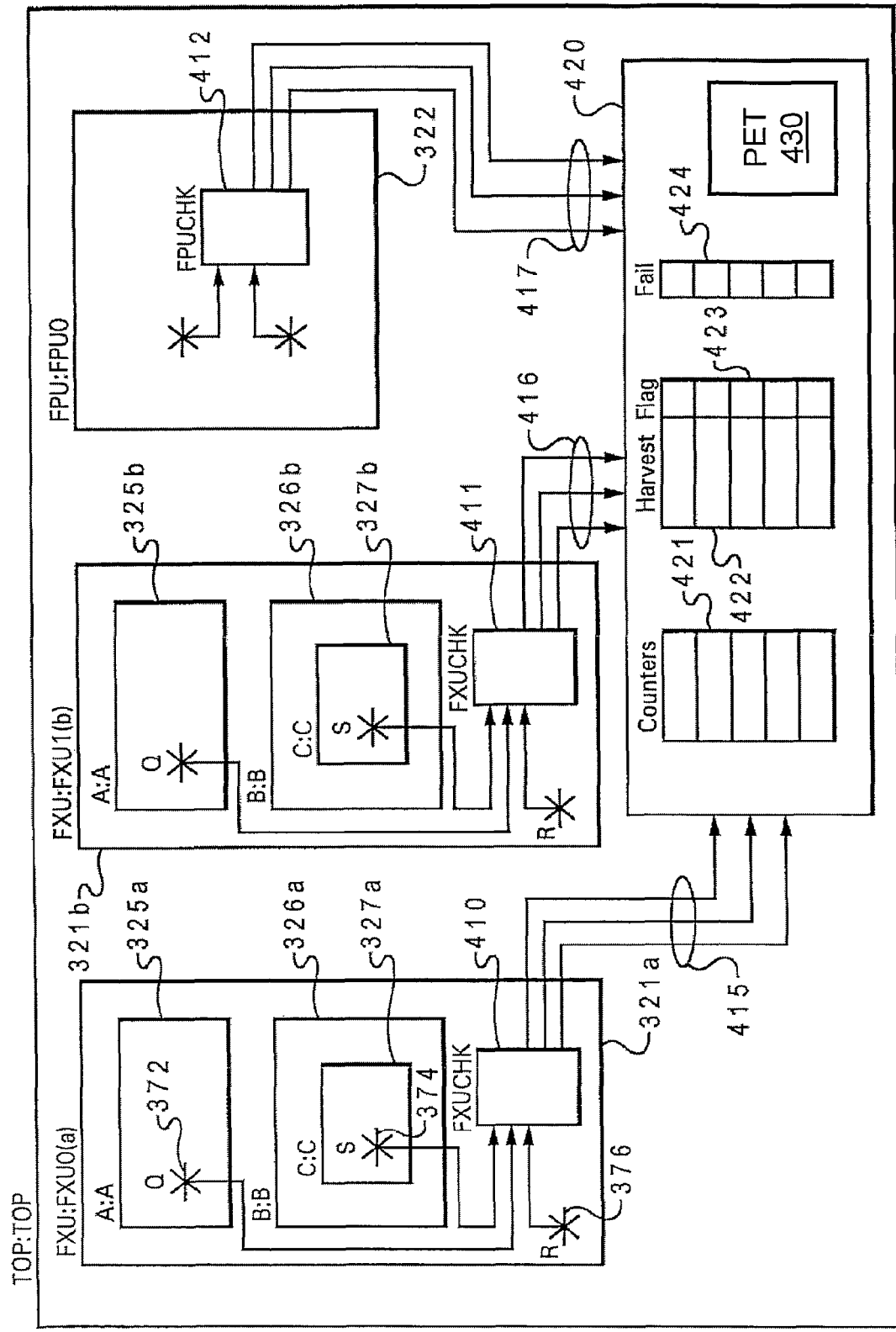
FIG. 4B is a simplified block diagram of a simulation model instrumented in accordance with the teachings of the present invention.

With reference now to FIG. 4B, there is depicted a block diagram representation of simulation model 329 instrumented in accordance with the teachings of the present invention. As can be seen in FIG. 4B, an instance 410 and an instance 411 of an instrumentation entity FXUCHK are utilized to monitor instances 321*a* and 321*b* of an FXU entity. For each FXU instantiations of 321*a* and 321*b*, an FXUCHK instantiation, 410 and 411 respectively, is automatically generated by the mechanism of the present invention. In a similar fashion, instrumentation entity FPUCHK 412 is instantiated to monitor FPU entity 322.

As depicted in FIG. 4B, entity FXUCHK monitors a signal Q 372, a signal R 376, and a signal S 374 within each of instances 321*a* and 321*b* of the FXU entity. Signal Q 372, is a signal within the instances 325*a* and 325*b* of descendant entity A. Likewise, signal S 374 is a signal within descendant entity C that resides within descendant entity B. Finally, signal R 376 occurs directly within FXU entity 321. Although an instrumentation entity may monitor any signal within a target entity or the target entity's descendent entities, signals outside the target entity cannot be monitored.

Each instrumentation entity is connected by means of fail, count, and harvest signals to instrumentation logic block 420 containing logic for recording occurrences of each of the event types. For the count events monitored in simulation model 329, a set of counters 421 is utilized to count the number of occurrences of each count event. In a similar manner, a set of flags 424 is utilized to record the occurrence of failure events. In addition, a set of counters 422 and flags 423 are combined and utilized to record the point at which a harvest event occurs and its occurrence, respectively. In one embodiment of the present invention, a cycle number is captured and stored utilizing counters 422 and flags 423 to record a harvest event. Finally, external instrumentation logic block 420 contains data structures, for example, a print event table (PET) 430, which as described further below, is utilized by a simulator system to generate and present selected print events during simulation of a simulation model 329.

To facilitate instantiation and connection of instrumentation entities, instrumentation entity HDL source code files include a specialized comment section, hereinafter referred to as "instrumentation entity description", that indicates the target entity, the signals within the target entity to be monitored, and information specifying types of events to be monitored.

With reference now to FIG. 4C, there is illustrated an exemplary HDL file 440 that describes instrumentation entity FXUCHK depicted in FIG. 4B. HDL file 440 utilizes the syntax of the VHDL hardware description language. In the VHDL language, lines beginning with two dashes ("--") are recognized by a compiler as being comments. The method and system of the present invention utilize comments of a non-conventional form to indicate information about an instrumentation entity. FIG. 4C depicts one embodiment of the present invention in which comments include two exclamation points following the initial dashes in order to distinguish these comments from conventional comments in instrumentation HDL file 440. It will be appreciated by those skilled in the art that the exemplary syntax utilized in FIG. 4C for the provision of unconventional comments is but one of many possible formats.

Within HDL file 440, the I/O ports of a FXUCHK entity are declared in entity declaration 450. Within entity declaration 450, three input ports, S_IN, Q_IN, and R_IN, respectively, are declared. Input ports, S_IN, Q_IN, and R_IN, will be attached to signal S, 374, signal Q, 372, and signal R, 376 respectively as described below. Input port, CLOCK, is also declared and will be connected to a signal, CLOCK, within the FXU entity. In addition, two output ports: fails (0 to 1) and counts (0 to 2) are declared. In this example, no harvest events are generated by the FXUCHK entity, and thus no harvest output port is declared. These output ports thus provide failure and count signals for two failure events and three count events. The names of the output ports are fixed by convention in order to provide an efficient means for automatically connecting these signals to instrumentation logic block 420.

A set of instrumentation entity descriptors 451 is utilized to provide information about the instrumentation entity. As illustrated in FIG. 4C, descriptor comments 451 may be categorized in a number of distinct sections: prologue and entity name declaration 452, an input port map 453, a set of failure message declarations 454, a set of counter declarations 455, a set of print event declarations 456, and an epilogue 457.

The prologue and entity name 452 serve to indicate the name of the particular target entity that the instrumentation entity will monitor. Prologue and entity name declaration 452 also serves as an indication that the instrumentation entity description has begun. Specifically, the comment "--!! Begin" within prologue and entity name 452, indicates that the description of an instrumentation entity has begun. The comment "--!! Design Entity: FXU" identifies the target entity which, in HDL file 440, is design entity FXU. This declaration serves to bind the instrumentation entity to the target entity.

Input port map 453 serves as a connection between the input ports of an instrumentation entity and the signals to be monitored within the target entity. The comments begin with comment "--!! Inputs" and end with comment "--!! End Inputs". Between these comments, comments of the form "--!! inst_ent_port_name=>trgt_ent_signal_name" are utilized, one for each input port of the instrumentation entity, to indicate connections between the instrumentation entity ports and the target entity signals. The inst_ent_port_name is the name of the instrumentation entity port to be connected to the target entity signal. The trgt_ent_signal_name is the name of the signal within the target entity that will be connected to the instrumentation entity port.

In some cases a signal to be monitored lies within a descendant of a target entity. This is the case for signal S 374, which is embedded within entity C which is a descendant of entity B 326 and target FXU entity 321. Input port map 453 includes an identification string for signal S 374, which consists of the instance names of the entities within the target entity each separated by periods ("."). This identification string is prepended to the signal name. The signal mapping comment within input port map 453 for signal S 374 is therefore as follows:

--!! S_IN=>B.C.S;

This syntax allows an instrumentation entity to connect to any signal within the target entity or the target entity's descendant entities. A signal appearing on the top level of the target design entity, has no pre-pended entity names; and therefore, has the following signal mapping comment:

--!! R_IN=>R;

For signals on the top level of the target entity, a special connection method is provided. If the signal to be connected to has the same name as its corresponding signal in the port map of the instrumentation entity, no input port mapping comment is required and the signal will be automatically connected if no such comment is present. In other words, if the input port mapping comment is of the form:

--!! signal=>signal;

where signal is a legal signal name without periods ("."), then the input port mapping comment is not required and the system of the present invention will automatically make the connect. It is also possible to provide comments of the form given above to explicitly denote the signal connection. This mechanism is only operative for signals on the top level of the target entity.

Failure message declarations 454 begin with a comment of the form "--!! Fail Outputs;", and end with a comment of the form "--!! End Fail Outputs;". Each failure event output is associated with a unique event name and a failure message. This message may be output by the simulation run-time environment upon detecting a failure event. The unique failure event name is utilized to identify the specific failure event within the model. Each failure event signal may be declared by a comment of the form "--!! n: <eventname> "failure message";" where n is an integer denoting the failure event to which the message is associated, <eventname> is the unique failure event name, and "failure message" is the message associated with the particular failure event. One and only one failure message declaration comment must be provided for each failure event monitored by the instrumentation entity.

Counter declaration comments 455 begin with a comment of the form "--!! Count Outputs;" and end with a comment of the form "--!! End Count Outputs;". Each count event output is associated with a unique variable name. This name is associated with a counter in counter logic 421 FIG. 4B. The variable name provides a means to identify and reference the particular counter associated with a particular count event. Thus, a comment of the form "--!! n: <varname>qualifying_signal [+/−];" is associated with each counter event output. Within this convention, n is an integer denoting which counter event in the instrumentation module is to be associated with a variable name "varname," and qualifying_signal is the name of a signal within a target design entity utilized to determine when to sample the count event pulse, as will be further described hereinbelow. The parameter "qualifying_signal" is followed by A+/−A to specify whether the qualifying signal will be a high active qualifying signal or a low active qualifying signal.

Print event declarations 456 begin with a prologue comment of the form "--!! Print Events;" and end with a comment of the form "--!! End Print Events;". Each print event is associated with a unique index number and a message that will be presented by the simulation runtime environment (e.g., within display 22, in a hardcopy printout, or a log file) in response to occurrence of a print event during a simulation run. Each print event is declared in the form "--!! n: valid signal name, "print message", signal name;" where n is an integer index number for the print event the print message is to be associated with, valid signal name identifies the valid signal that, when asserted, causes the occurrence of the print event, "print message" is the message to be associated with the particular print event, and signal name identifies the signal, if any, whose value is reported in the print message.

As described in detail below with reference to FIGS. 6B, 7 and 8, each print event may further optionally be associated with a print event name by the print event declaration in order to facilitate grouping of one or more print events into print event groups. The use of print event groups permits multiple print events to be "turned on" or "turned off" in simulation by referencing the print event group rather than by referencing each constituent print event.

As noted in FIG. 4C, the print message may include formatting information (e.g., "%2h") that may advantageous employ the syntax similar to or the same as that of the well-known printf statements in the C programming language. Thus, when the print event is presented, each instance of the percent symbol (i.e., "%") is replaced by the value of the signal name, with the value formatted in terms of length and encoding (e.g., binary (b), decimal (d), hexadecimal (h), or octal (o)) as indicated in the print message. For example, for the print event identified by index 0, the signal value of the 6-bit signal op_type will be presented by two hexadecimal characters in response to the specification of "2h" formatting in the associated print event declaration. If no field width is given in the formatting information (e.g., "% h"), the signal value is fully displayed with the minimum number of characters necessary to represent the signal value in the specified encoding.

By default, signal values are formatted as right-justified, meaning that any unused width indicated by the formatting information (e.g., 8 bits for 2 hex places) is filled by padding the leftmost (high order) side of the signal value with 0's. If, on the other hand, the width of the signal value exceeds that indicated by the formatting information, the rightmost bits are presented, and the high order bits are truncated to achieve right justification. However, because some signal values are better viewed with left justification, this format is preferably supported, for example, by the inclusion of the "<" flag. With left justification, the right-hand side of the signal value is padded with 0's if the signal value has a smaller width than that specified by the formatting information and low-order bits are truncated if the signal has a greater width than that specified by the formatting information.

Harvest messages and event names, fail messages and event names, and counter variable names for a simulation model, and print event messages and event names are included in a simulation executable model, and lists of all the events within the model are produced in separate files at model build time. In this manner, each simulation model includes the information for each event monitored, and a separate file containing this information for each event is available. Furthermore, as will be described below, the model build process names each event within the model (count, fail, harvest and print) in such a manner as to insure that each event has a unique name with certain useful properties.

Finally, epilogue comment 457 consists of a single comment of the form "--!! End;", indicating the end of descriptor comments 451. The remainder of instrumentation entity HDL file 440 that follows the I/O declarations described above is an entity body section 458. In entity body section 458, conventional HDL syntax is utilized to define internal instrumentation logic necessary to detect the various events on the input port signals and convey these events to the output port signals.

In addition to descriptor comments 451, that are located in the HDL source code file for an instrumentation entity, an additional comment line is required in the target entity HDL file. A comment of the form "--!! Instrumentation: name.vhdl", where name.vhdl is the name of the instrumentation entity HDL file, is added to the target entity HDL source code file. This comment provides a linkage between the instrumentation entity and its target entity. It is possible to have more than one such comment in a target entity when more than one instrumentation entity is associated with the target entity. These HDL file comments will hereinafter be referred to as "instrumentation entity instantiations".

Figure 4D:
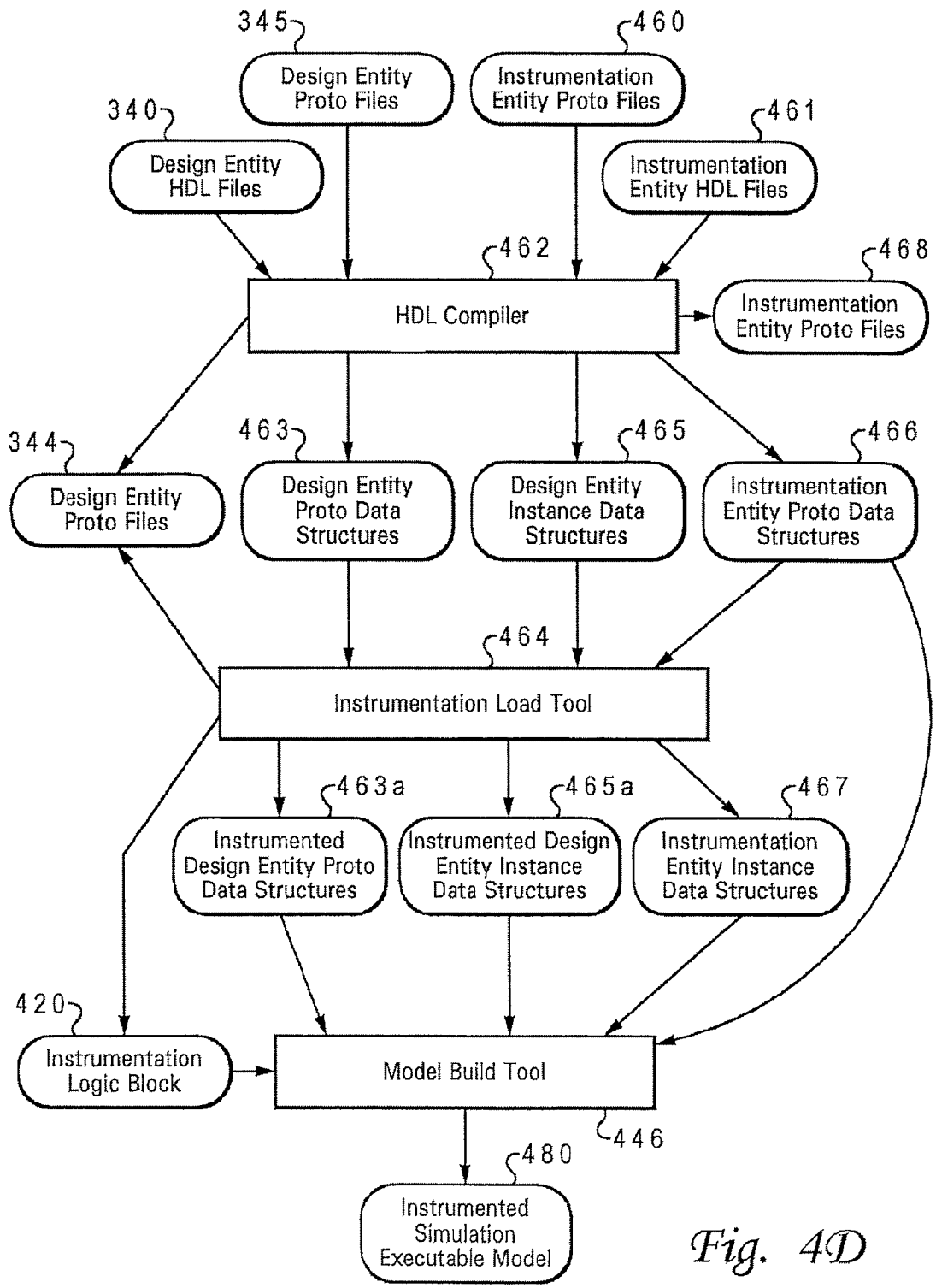
FIG. 4D is a flow diagram depicting a model build process in accordance with the teachings of the present invention.

With reference now to FIG. 4D, there is depicted a model build process in accordance with the teachings of the present invention. In this model build process, instrumentation load tool 464 is utilized to alter the in-memory proto and instance data structures of a simulation model thereby adding instrumentation entities to the simulation model. Instrumentation load tool 464 utilizes descriptor comments 451 within instrumentation HDL files 461 to create instance data structures for the instrumentation entities within a simulation model.

The model build process of FIG. 4D begins with design entity HDL files 340 and, potentially, one or more design entity proto files 345 (available from a previous run of HDL compiler 462), instrumentation entity HDL files 460, and potentially, one or more instrumentation entity proto files 461 (available from a previous run of HDL compiler 462). HDL compiler 462, processes design entity HDL files 340, and instrumentation entity HDL files 460 following an augmentation of algorithm process_HDL_file( ) that provides for efficient incremental compilation of the design and instrumentation entities comprising a simulation model. HDL compiler 462 loads proto data structures from design entity proto files 345 and instrumentation entity proto files 460, if such proto files are available and consistent. If such proto files are not available or are not consistent, HDL compiler 462 compiles design entity HDL files 340 and instrumentation entity HDL files 460 in order to produce design entity proto files 344 and instrumentation entity proto files 468. (Design entity proto files 344 and instrumentation entity proto files 468 are available to serve as design entity proto files 345 and instrumentation entity proto files 460 respectively for a subsequent run of HDL compiler 462.) Instrumentation entity proto files 468 contain print event information derived from the print event declarations 456 contained in instrumentation entity HDL files 461. As described below with reference to FIG. 6B, instrumentation entity proto files 468 may also contain print event information derived from print event declaration statements within design entity HDL files 340.

In addition, HDL compiler 462 creates in-memory design proto data structures 463 and design instance data structures 465 for the design entities of a simulation model. HDL compiler 462 also creates in-memory instrumentation proto data structures 466 for the instrumentation entities of a simulation model. As with instrumentation entity proto files 468, in-memory instrumentation proto data structures 466 contain print event information derived from the print event declarations 456 contained in instrumentation entity HDL files 461 and/or design entity HDL files 340.

In order to minimize processing overhead HDL compiler 462 neither reads nor processes descriptor comments 451. However, HDL compiler 462 does recognize instrumentation entity instantiation comments within target entity HDL files. As such, HDL compiler 462 cannot create instance data structures instrumentation entity data structures 467. The creation of instance data structures requires interconnection information contained within descriptor comments 451 not processed by HDL compiler 462. HDL compiler 462 does, however, create instrumentation proto data structures 466.

The in-memory design proto data structures 463, design instance data structures 465, and instrumentation entity proto data structures 466, are processed by instrumentation load tool 464. Instrumentation load tool 464 examines design entity proto data structures 463 and design entity instance data structures 465 to determine those design entities that are target entities. This examination is accomplished by utilizing a particular comment format as previously described.

All target entities that are loaded from design entity proto files 345 contain an instantiation for any associated instrumentation entity. Therefore, instrumentation load tool 464 merely creates an instance data structure 467 for any such instrumentation entity and passes, the unaltered design proto data structure 463 to instrumented design proto data structure 463a, and passes design instance data structure 465 to instrumented design instance data structure 465a.

If however, a target entity is loaded from design entity HDL files 340, rather than from design entity proto files 345, instrumentation load tool 464 must alter its design proto data structure 463 and its design instance data structure 465 to instantiate an associated instrumentation entity. An instrumented design proto data structure 463a and instrumented design instance data structure 465a are thereby produced. In addition, instrumentation load tool 464 creates an instrumentation instance data structure 467 for each instrumentation entity associated with the current design entity.

The design entity proto data structures 463 that are altered by instrumentation load tool 464 are saved to disk 33 of computer system 10 as design entity proto files 344. Design entity proto files 344, which may include references to instrumentation entities, are directly loaded by a subsequent compilation of a simulation model, thus saving processing by instrumentation load tool 464 on subsequent recompilations unless an alteration is made to a design entity or an associated instrumentation entity.

In order for HDL compiler 462 to determine if alterations were made to either a target design entity or the target design entity's associated instrumentation entities, the BOM of a target design entity is expanded to include the HDL files constituting the instrumentation entities. In this manner, HDL compiler 462 can determine, by inspection of the BOM for a given design entity, whether to recompile the design entity and the design entity's associated instrumentation entities or load these structures from proto files 345 and 461.

Finally, instrumentation load tool 464 creates a unique proto and instance data structure for instrumentation logic block 420 and connects the fail, harvest, and count event signals from each instrumentation entity instantiation to instrumentation logic block 420. Within the proto and instance data structure for instrumentation logic block 420, instrumentation load tool 464 creates a print event table 430 based upon the print event information contained in in-memory instrumentation entity proto data structures 466. Model build tool 446 processes in-memory proto and instance data structures 463*a*, 465*a*, 467, 466 to produce instrumented simulation executable model 480.

In HDL compiler 462, algorithm process_HDL_file( ) is augmented to allow for the incremental compilation of design and instrumentation entities. A pseudocode implementation of a main control loop of HDL compiler 462 is shown below:

```
process_HDL_file2(file,design_flag)                        5
{                                                         10
    if (NOT proto_loaded(file)) {                         15
        if (exists_proto_file(file) AND check_bom(file)) { 20
            load_proto(file);                             25
        }else {                                           30
            parse_HDL_file(file)                          35
            for (all instances in file) {                 40
                process_HDL_file2(instance, design_flag); 45
            }                                             50
            if (design_flag=TRUE) {                       55
                for (all instrumentation instances in file){  60
                    process_HDL_file2(instance, FALSE);   65
                }                                         70
            }                                             75
            create_proto(file);                           80
            write_proto_file(file);                       90
        }                                                 95
    }                                                    100
    if (design_flag=TRUE) {                              105
        create_instance(file);                           110
    }                                                    115
}                                                        120
```

Algorithm process_HDL_file2( ) is an augmentation to process_HDL_file( ) of HDL compiler 342 in order to support the creation of instrumented simulation models. The algorithm is invoked with the name of the top level design entity passed through parameter file and a flag indicating whether the entity being processed is a design entity or an instrumentation entity passed through parameter design_flag (design_flag=TRUE for design entities and FALSE for instrumentation entities). Algorithm process_HDL_file2( ) (line 5) first checks, by means of routine proto_loaded( ) (line 15), if the proto for the current entity is already present in memory 44. If so, processing passes to line 105. Otherwise, control is passed to line 20 and 25 where disk 33 of computer system 10 is examined to determine if proto files for the entity and its descendants (including instrumentation entities, if any) exist and are consistent. If so, the appropriate proto files are loaded from disk 10 by routine load_proto( ) (line 25) creating proto data structures, as necessary, in memory 44 for the current entity and the current entity's descendants including instrumentation entities.

If the proto file is unavailable or inconsistent, control passes to line 35 where the current entity HDL file is parsed. For any entities instantiated within the current entity, lines 40 to 55 recursively call process_HDL_file2( ) (line 5) in order to process these descendants of the current entity. Control then passes to line 55 where the design_flag parameter is examined to determine if the current entity being processed is a design entity or an instrumentation entity. If the current entity is an instrumentation entity, control passes to line 80. Otherwise, the current entity is a design entity and lines 60 to 70 recursively call process_HDL_file2( ) (line 5) to process any instrumentation entities instantiated by means of instrumentation instantiation comments. It should be noted that algorithm process_HDL_file2( ) (line 5) does not allow for instrumentation entities to monitor instrumentation entities. Any instrumentation entity instantiation comments within an instrumentation entity are ignored. Control then passes to line 80 where proto data structures are created in memory 44 as needed for the current entity and any instrumentation entities. Control then passes to line 90 where the newly created proto data structures are written, as needed to disk 33 of computer system 10.

Control finally passes to line 105 and 110 where, if the current entity is a design entity, instance data structures are created as needed for the current entity and the current entity's descendants. If the current entity is an instrumentation entity, routine create_instance( ) (line 110) is not called. Instrumentation load tool 464 is utilized to create the in-memory instance data structures for instrumentation entities.

It will be apparent to those skilled in the art that HDL compiler 462 provides for an efficient incremental compilation of design and instrumentation entities. It should also be noted that the above description is but one of many possible means for accomplishing an incremental compilation of instrumentation entities. In particular, although many other options also exist, much, if not all, of the functionality of instrumentation load tool 464 can be merged into HDL compiler 462.

Figure 4E:
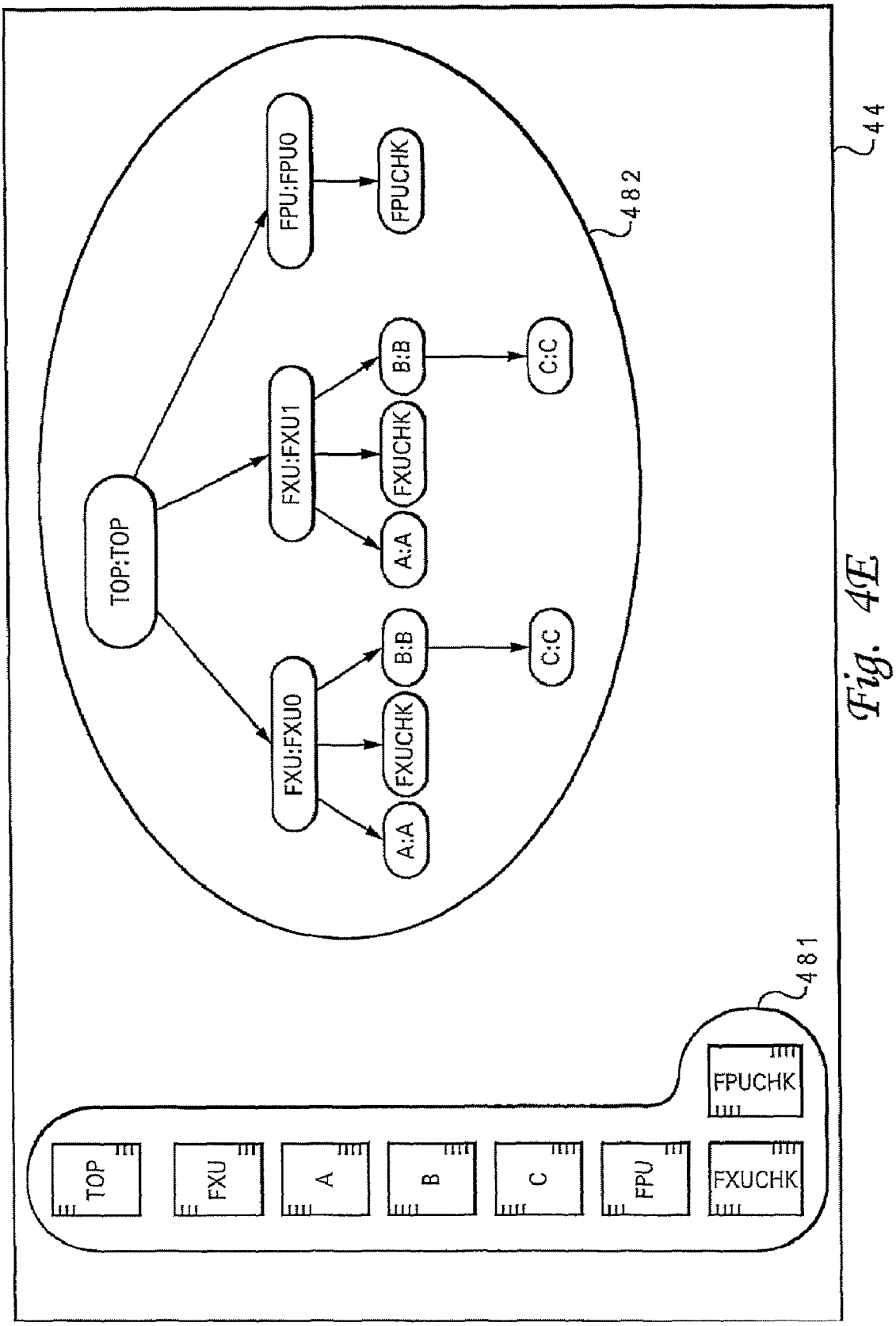
FIG. 4E is a block diagram representation of memory data structures constructed in accordance with the teachings of the present invention.

With reference now to FIG. 4E wherein is shown a depiction of memory 44 at the completion of compilation of simulation model 329 with instrumentation entities FXUCHK and FPUCHK. Memory 44 contains proto data structures 481, one for each of the design and instrumentation entities referred to in simulation model 329. In addition, design and instrumentation instances in simulation model 329 are represented by instance data structures 482. The instance data structures are connected by means of pointers indicating the hierarchical nature of the instantiations of the design and instrumentation entities within simulation model 329.

A preferred embodiment of the present invention employs an event naming schema within a simulation model that prevents name collisions between events in different instrumentation entities, allows for the arbitrary re-use of components of a model in models of arbitrarily increasing size, and furthermore allows for processing designated events in a hierarchical or non-hierarchical manner.

When all instances of an event are considered as a whole without regard to specific instances, the event is considered in a "non-hierarchical" sense. Likewise, when an event is considered with regard to each and every instance, it is considered in a "hierarchical" sense. When considering count events, for example, it is often convenient to track the number of times a particular count event occurred in the aggregate without concern to exactly how many times the count event occurred in each particular instance within a simulation model.

Each type of event: count, fail, harvest, print, etc. is given a separate event namespace by construction. Each event class is therefore an independent group preventing naming collisions between the event types. The data structure of the present invention is independently applied to each of the different event types to ensure correctness within each event class.

In the embodiments illustrated in FIGS. 5A, 5B, 5C, and 5D, the present invention are described with respect to count events. One skilled in the art will appreciate and understand the extensions necessary to apply the same techniques to other event classes such as failure, harvest, or print events.

With reference to FIG. 5A, there is depicted a block diagram representation of simulation model 1000 containing a number of design and instrumentation entities. As illustrated in FIG. 5A, simulation model 1000 includes two instances of a design entity X, with instance names X1 and X2 respectively.

Within each of design entity instances X1 and X2 is instantiated an instance of an instrumentation entity B3, 1012a and 1012b. Design entity instances X1 and X2 further comprise instances, 1014a and 1014b, respectively, of design entity Z which further contains instances, 1016a and 1016b, of instrumentation entity B1 and instances, 1018a and 1018b, of instrumentation entity B2.

Finally, simulation model 1000 includes an instance of design entity Y, with instance name Y, containing an instance of instrumentation entity B4 1022. Design entity instance Y contains an instance, 1024, of design entity Z with further instances, 1016c and 1018c, of instrumentation entities B1 and B2 respectively.

In what follows the methods of the present invention for uniquely naming events will be considered in the context of exemplary model 1000. It will be assumed in the following description that each instrumentation entity (B1, B2, B3, and B4) has declared a single count event with event name "count1".

In accordance with the present invention, the user must uniquely name each type of event (count, fail, harvest, print, etc.) within a specific instrumentation entity, i.e., the user cannot declare any two events of the same type within the same instrumentation entity with the same event name. Such a constraint does not conflict with the stated goals of the present invention in that a given instrumentation entity is usually created by a specific person at a specific point in time, and maintaining unique names within such a limited circumstance presents only a moderate burden to the user. The data structure disclosed herein does, however, prevent all name collisions between events in different instrumentation entities, and allows for processing the events in a hierarchical and/or non-hierarchical manner.

As previously explained, an HDL naming convention must uniquely identify all the entities within a given design. This constraint is inherent to HDLs and applies to design entities as well as instrumentation entities. In accordance with conventional VHDL entity naming constructs, it is technically possible for two design entities to share the same entity name, entity_name. However, such identically named entities must be encapsulated within a VHDL library from which a valid VHDL model may be constructed. In such a circumstance, entity_name, as it is utilized herein, is equivalent to the VHDL library name concatenated by a period (".") to the entity name as declared in the entity declaration.

Pre-pending a distinct VHDL library name to the entity name disambiguates entities sharing the same entity name. Most HDLs include a mechanism such as this for uniquely naming each design entity. Design entities must be unambiguously named in order to determine which particular entity is called for in any given instance in a simulation model. The present invention employs the prevailing naming mechanism of the native HDL to assign unique entity names for design entities throughout a given model and leverages the uniqueness property of entity names and the uniqueness of each instance's instantiation identifier to create an "extended event identifier" for each event within the simulation model.

With reference to FIG. 5B, there is illustrated a representation of the fields in an extended event identifier data structure, alternatively referred to herein as an "event list", in accordance with one embodiment of the present invention. The extended event identifier begins with instantiation identifier field 1030. This field, as described hereinbefore, consists of the instance identifiers, proceeding from the top level entity to the direct ancestor of the given instance within the simulation model separated by periods ("."). This string is unique for each and every instance of the event within the model. The extended event identifier further includes an instrumentation entity field 1032, a design entity field 1034, and an eventname field 1036.

Instrumentation entity field 1032 contains the name of the instrumentation entity (or the name assigned to an embedded instrumentation entity) that generates the simulation event. Design entity field 1034 contains the entity name of the design entity in which the event occurs. Eventname field 1036 is the name given to the event in the instrumentation entity description comments of an instrumentation entity or the event name assigned to an event within all embedded instrumentation entity. These four namespace fields comprise a unique identifier for each event within a simulation model that allows for the re-use of components within other models without risk of name collisions and the consideration of events in a hierarchical or non-hierarchical sense.

With reference now to FIG. 5C, there is shown a list of extended event identifiers for model 1000. Event identifiers 1040, 1041, 1042, 1043, 1044, 1045, 1046, 1047, and 1048 are declared within simulation model 1000 to designate count events having eventname "count1". The extended event identification procedure of the present invention will be described in the context of these extended event identifiers.

The uniqueness of the names in design entity name field 1034 is a primary distinguishing factor between events. By including the design entity name in the extended event identifier, each design entity is, in effect, given a unique namespace for the events associated with that design entity, i.e., events within a given design entity cannot have name collisions with events associated with other design entities.

It is still possible however, to have name collisions between events defined by different instrumentation entities that are incorporated within a single design entity. Events 1041 and 1042, for example, if identified solely by the design entity name, have a name collision. Both are events with eventname "count1" within design entity Z, and if labeled as such, are indistinguishable. In order to alleviate a naming collision between events 1041 and 1042, the present invention employs instrumentation entity field 1032. By referencing the design entity and instrumentation entity names, both of which are unique with respect to themselves and each other, a unique event namespace is created for each instrumentation entity associated with any given design entity. For example, event identifier 1041 and 1042 would be in conflict (both named Z.count1), unless the respective instrumentation entity names are included within the extended event identifier to produce names B1.Z.count1 and B2.Z.count2 for these events.

It should be noted that it is possible to uniquely name each event by using instrumentation entity name field 1032 alone. Due to the uniqueness property of instrumentation entity names, event names that are only named by the instrumentation entity name and the event name field will be necessarily unique.

However, such a naming scheme is insufficient for associating events with a given design entity. In practice, it is desirable to associate events with the design entity in which they occur rather than associating them with the potentially numerous instrumentation entities that are utilized to track them. Moreover, referencing the appropriate design entity within the eventname allows all the events associated with a given design entity to be centrally referenced without the need to ascertain the names of all the instrumentation entities associated with the given design entity. The data structure of the present invention utilizes both the instrumentation entity and design entity names in naming events for ease of reference at the cost of moderate uniqueness redundancy in the event names.

In an alternative embodiment of the present invention, the instrumentation entity name is not included within the extended event identifier. Referring to FIG. 5D, such an alternative extended event identification data structure is depicted. As shown in FIG. 5D, events are named by instantiation identifier field 1030, design entity name field 1034, and event name field 1036.

Such a data structure provides name collision protection between design entities but not within design entities. That is, the user must ensure that events names for events associated with a given design entity do not collide. In case of user error in this regard, model build tools may be utilized to detect an event name collision condition during model compilation. The alternative data structure depicted in FIG. 5D provides for simpler naming and referencing of events at the expense of requiring the user to prevent name collisions for events associated with a given design entity.

Returning to FIG. 5B, the combination of instrumentation entity field 1032, design entity name field 1034, and event-name field 1036 for a given event, provides a unique identifier for any given event without regard to multiple instantiations of the event. In order to uniquely distinguish between multiple instantiations of an event, instantiation identifier field 1030 is included in the extended event identifier. Instantiation identifier field 1030 field, by its construction, provides a unique string for any instance of an entity within any simulation model.

When evaluating occurrences of an event in a non-hierarchical sense, instantiation identifier field 1030 is ignored while searching for matching events. As illustrated in FIG. 5C, for example, a non-hierarchical query for the number of time a "count1" event occurs within design entity Z as detected by instrumentation entity B1, utilizes the following list of count eventnames:

| X1.Z | B1 | Z | COUNT1 |
| X2.Z | B1 | Z | COUNT1 |
| Y.Z | B1 | Z | COUNT1. |

These count events are added together to form an aggregate count of the total number of time the specific event occurred within the simulation model.

A hierarchical query includes specific criteria to match against the hierarchy field to limit the counter or counters found to specific instances of the requested event. For example, a query to obtain the count1 event of instrumentation entity B1 within the X1.Z instance of design entity Z utilizes the following count eventname:

| X1.Z | B1 | Z | COUNT1, | which represents the number of times the count1 event was counted by instrumentation entity B1 within design entity instance X1.Z for a particular simulation interval.

By providing matching model hierarchy criteria against instantiation identifier field 1030, it is possible to consider the events with respect to their particular instance or instances within the model, i.e., a hierarchical query. A non-hierarchical query merely ignores the hierarchy field and returns all the instances of the requested events within the model.

The above described system and method provides for practical instrumentation of simulation models and allows for efficient implementation of instrumentation logic through embedded instrumentation entities. Embedded instrumentation entities, as described hereinabove, are however necessarily limited to task-specific implementations. As described with reference to FIGS. 6A and 6B, the present invention further provides for a more flexible implementation of instrumentation logic in a more unstructured manner.

Figure 6A:
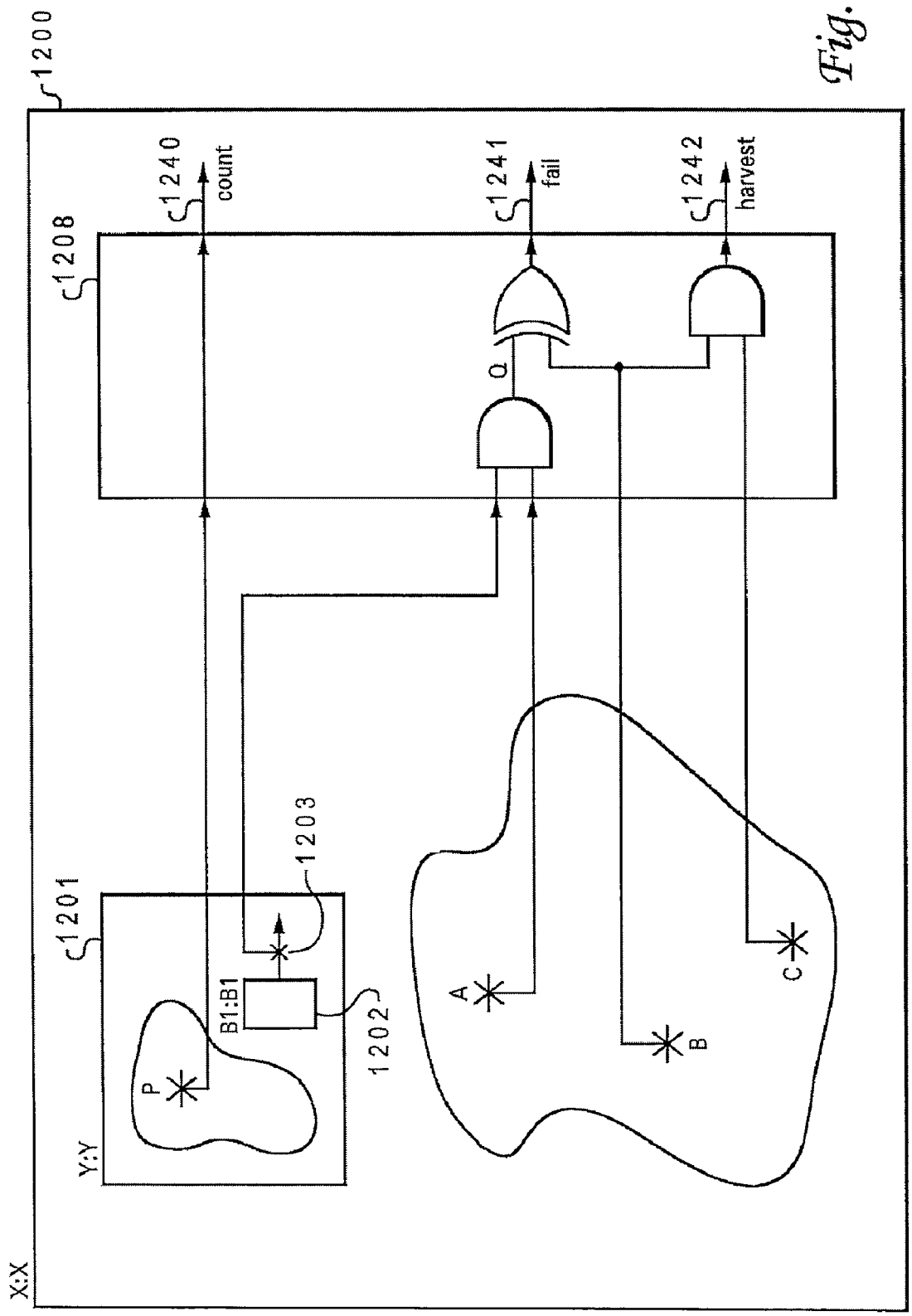
FIG. 6A depicts a representative target design entity with an instrumentation entity containing random instrumentation logic implemented in accordance with the teachings of the present invention.

It is often necessary to tailor instrumentation logic to address unique problems and circumstances. Instrumentation logic of a specific and yet non-predefined nature that is designed in accordance with the techniques disclosed herein with reference to FIGS. 6A and 6B is referred herein as "random instrumentation logic." A data construct consisting of general logic primitives (Boolean operators, storage elements, etc.) and an interconnection method for these primitives is utilized for implementing such random instrumentation logic.

For instrumenting a simulation model as described heretofore, an HDL such as VHDL or Verilog is utilized as a platform from which instrumentation logic is generated. Appropriate instrumentation entity descriptor comments within design entity source code files couple the resultant instrumentation entities to designated target design entities within a simulation model.

In addition to entity descriptor comments within a design entity source code file, the foregoing instrumentation technique requires a separate HDL file in which the instrumentation entity is described. As explained with reference to FIGS. 6A and 6B, the present invention provides a method, system, and data structure for instrumenting design entities within a simulation model while avoiding the design process overhead required for creating a separate instrumentation entity HDL file.

In accordance with a preferred embodiment of the present invention, random instrumentation logic is directly deployed within target design entities in terms of individualized and customizable instrumentation descriptor comments. Such instrumentation descriptor comments are encoded within the target design entity HDL source code file and provide a means for the describing random instrumentation logic, events, and interconnections between the created instrumentation logic and the target design entity. The random instrumentation logic is inserted into the simulation model in a manner similar to the techniques used for embedded instrumentation entities to produce an instrumentation entity without the need for the creation of an explicit HDL instrumentation entity file.

With reference to FIG. 6A, there is illustrated a representative target design entity 1200 wherein random instrumentation logic is implemented in accordance with a preferred embodiment of the present invention. Instantiated within target design entity 1200 is a design entity 1201. As further depicted in FIG. 6A, an instrumentation entity 1202 is instantiated within design entity 1201. Instrumentation entity 1202 is designed in accordance with the principles set forth hereinabove to generate a count event 1203 having an event name "count1." Target design entity 1200 further includes an instrumentation entity 1208 that is generated utilizing random instrumentation logic. As depicted in FIG. 6A, instrumentation entity 1208 receives as inputs signals P, A, B, and C along with count event 1203.

Instrumentation entity 1208 is constructed by a set of unconventional comments lines within the source code file for target design entity 1200. These comments may be incorporated at any point within the logic description section of the HDL source code file. HDL compiler 462 (FIG. 4B) recognizes the unconventional comments in addition to any comments utilized to instantiate embedded instrumentation entities within design entity 1200. During the post-compilation/model build phase, instrumentation load tool 464 processes these comments in a manner similar to that utilized for embedded instrumentation entities to generate instrumentation entity 1208.

A variety of possible syntaxes can be utilized to formulate the unconventional HDL comments required for generating random instrumentation logic within the source code file of a target design entity. As depicted in FIG. 6B, much of the syntax of these comments employs syntax similar to the concurrent subset of the VHDL language with the addition of syntactic and semantic enhancements that provide a means of connection between an instrumentation entity and its target design entity. In addition, minor syntactic and semantic enhancements are provided to declare events and intermediate signals.

With reference now to FIG. 6B, there is illustrated an exemplary HDL source code file 1220 that describes design entity 1200. Within HDL source code file 1220, an entity instantiation 1221 produces design entity 1201, and assignment statements 1222 are utilized to generate signals A, B, and C. A set of unconventional comments 1223 within HDL source code file 1220 is utilized to produce instrumentation entity 1208.

Comments 1223 for count, fail and harvest events are formulated as left-hand side (l.h.s.)/right-hand side (r.h.s.) assignment statements of the form:

{l.h.s.}<={r.h.s.};

where {l.h.s.}, referred to herein after as lhs, is the assignment statement target and, {r.h.s.}, referred to herein after as rhs is an expression denoting the logical value to be assigned to the statement lhs. In a preferred embodiment, comments for print events are similarly constructed. However, in this embodiment, comments specifying print events include only a lhs, but do not include an assignment operator (i.e., <=) or a rhs. A number of rules delineate the possible expressions for lhs and rhs in any legal statement in the instrumentation comments.

As employed within the instrumentation data structure of the present invention, an lhs statement may be either an event declaration or the name of a signal that is instantiated within an instrumentation entity. An event declaration is an expression within bracket characters ("[A, A]") that generates a new event. Within comments 1223, a statement 1230 produces a count event 1240 from instrumentation entity 1208 (FIG. 6A) having eventname "countname( )". Similarly, statement 1238 declares a print event having the eventname "pevent1".

Within an lhs event declaration, a first field designates the event type (count, fail, harvest, print, etc.) and is followed by such other fields as are necessary to declare the event. As illustrated in lines 1230, 1234, 1236 and 1238, such event declaration fields generally follow the same format as the event declaration fields depicted in FIG. 4C. Thus, print event declarations such as statement 1238 have the general format of:

--!! [print; eventname, valid signal name, "print message", signal name];

where print is a keyword identifying the statement as a print event declaration, eventname is the name of the print event declared by the statement, valid signal name identifies the valid signal that, when asserted, causes the occurrence of the print event, "print message" is the message to be associated with the particular print event, and signal name identifies the signal, if any, whose value is reported in the print message. It will be appreciated that in some embodiments of the present invention, signal name can be extended to form a field containing a comma delimited list of multiple signal names reported in the print message. Similarly, the valid signal name field can be extended to support an expression that defines the valid signal for the print event in terms of a logical combination of multiple signals (e.g., valid1 AND valid2) within the simulation executable model 480. Because those skilled in the art will readily understand the extensions to the described embodiment required to support the definition of a valid signal name with an expression, such extension are not described further herein.

Comments 1223 further include a line 1232 having an lhs that declares a signal Q within instrumentation entity 1208. To prevent ambiguity, any signal declared in this manner may not have a name corresponding to the name of any signal present on the top level of target design entity 1200. Conformance to this requirement is verified by instrumentation load tool 464 (FIG. 4D) during processing. Signals declared by an lhs expression may be incorporated within an rhs expression as shown in lines 1232 and 1234.

An rhs consists of logical connectivity expressions and/or functions that combine various signals. Signals within these connectivity expressions may originate from a number of possible sources including: signals declared on the lhs of a statement in the instrumentation comments; signals within the target design entity; or signals designating other events within the target design entity.

The absence of period (".") or bracket ("[", "]") characters within a signal value description in the rhs of a statement, designates the object signal as corresponding to either a signal within the top hierarchical level of the target design entity or to a signal declared on the lhs of a statement within the instrumentation language. Signals are named in a mutually exclusive manner by the rules governing creation of signals on the lhs of a statement in the instrumentation comments, thereby preventing any ambiguity in the determining the source of the given signal.

Signals in rhs connectivity expressions (and for print events, signals in the lhs) can also be specified as being located within entities instantiated within the target design entity. In such a circumstance, the instance names of the entity or entities in the hierarchy enclosing the desired signal are placed before the signal name in hierarchy order, delineated by period (".") characters. For example, the signal in statement 1230 ("Y.P") represents signal 1204 within design entity 1201. Signals at any level of the target design hierarchy are thus accessible to instrumentation logic generated by the instrumentation language comments.

Signals within the instrumentation comment expressions can also designate other events within the target entity. Event identifiers as described hereinbefore for hierarchical events are used to denote such "event" signals. For example, statement 1232 performs a logical AND of instrumentation event 1203 and signal A. The event identifier "Y[B1.count.count1]" connects instrumentation entity 1208 to instrumentation event 1203. This notation permits instrumentation events at any level of design hierarchy within target design entity 1200 to be directly accessed.

As further depicted in FIG. 6B, statement 1232 produces intermediate signal Q within instrumentation entity 1208. This is an example of an instrumentation comment statement declaring a new intermediate signal. These signals can be used in other statements to construct random instrumentation logic of any desired depth or complexity.

Statement 1234 utilizes intermediate signal Q along with signal 1206 to produce fail event 1241. The syntax for fail event declaration includes a field denoting the type of event ("fail"), a field giving the event name for the fail event ("failname0"), and a final field denoting the message to associate with the fail. Finally, statement 1236 produces harvest event 1242.

In general, the rhs expression of any statement in the instrumentation data structure of the present invention can access any signal or instrumentation event signal within the target design entity utilizing these syntactic mechanisms. These signals can be combined to form new events or intermediate signals that can themselves be further combined to form instrumentation logic of any desired depth or complexity.

Instrumentation comments can be placed anywhere within the logic description section of the target entity source code file. All instrumentation comments within a file are considered as a whole and produce a single instrumentation entity within the target design entity.

As noted briefly above, the naming of print events facilitates the aggregation of designer-selected print events into various print event groups that can be selectively "turned off" and "turned on" as a group during a simulation run. FIG. 7 illustrates a block diagram of a simplified simulation model instrumented with print events and print event groups in accordance with the present invention. In the exemplary simulation model, a top-level design entity instance 700 named TOP:TOP instantiates two instances 702a, 702b of an FXU design entity, which are respectively named FXU: FXU_inst1 and FXU:FXU_inst2. Each instance 702 of the FXU design entity in turn includes a design entity instance 704 named a:a, which contains a design entity instance 706 named b:b.

Figure 7:
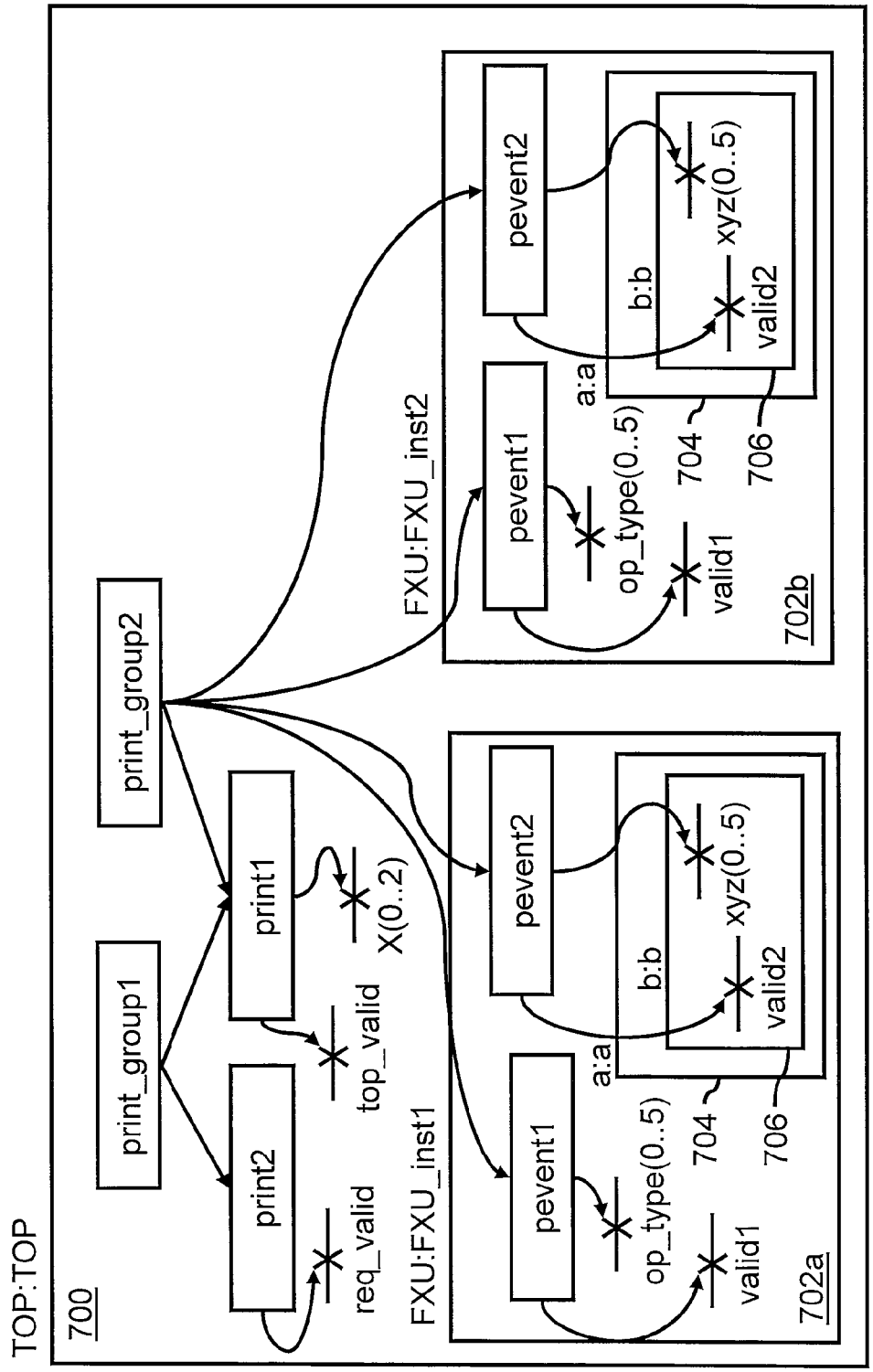
FIG. 7 is a block diagram of a simplified simulation model instrumented with print events and print event groups in accordance with the present invention.

As further illustrated in FIG. 7, top-level design entity instance 700 further instantiates two print events named print1 and print2. These print events may be instantiated, for example, by including within the HDL file describing top-level design entity 700 statements such as:

--!! [print; print1; top_valid; "Signal X is % h", X(0 to 2)];
    --!! [print; print2; req_valid; "Request activated"];

It should be noted that the declaration of print event print2 does not include a signal name, only a valid signal name. Consequently, print event print2 is presented when the signal req_valid is asserted.

Two other print events, pevent1 and pevent2, are instantiated within each of the two instances 702a, 702b of the FXU design entity. If instantiated from the HDL file describing the FXU design entity, these print events can be declared with the following statements:

--!! [print; pevent1; valid1; "Op type is %2h", op_type(0 to 5)];
    --!! [print; pevent2; a.b.valid2; "Signal xyz is %2h", a.b.xyz(0 to 5)];

As noted above, print events with equivalent functionality can alternatively be declared within the HDL file for top-level design entity 700 with the following statements:

```
--!! [print; pevent1_FXU1; FXU_inst1.valid1;
    "Op type is %2h", FXU_inst1.op_type(0 to 5)];
--!! [print; pevent1_FXU2; FXU_inst2.valid1;
    "Op type is %2h", FXU_inst2.op_type(0 to 5)];
--!! [print; pevent2_FXU1; FXU_inst1.a.b.valid2;
    "Signal xyz is %2h", FXU_inst1.a.b.xyz(0 to 5)];
--!! [print; pevent2_FXU2; FXU_inst2.a.b.valid2;
    "Signal xyz is %2h", FXU_inst2.a.b.xyz(0 to 5)];
```

Top-level design entity 700 further instantiates two print event groups, namely, print_group1, which includes print events print1 and print2, and print_group2, which includes print events print1, FXU_inst1.pevent1, FXU_inst1.pevent2, FXU_inst2.pevent1, and FXU_inst2.pevent2. These print event groups can be instantiated through the inclusion of the following statements within the HDL file describing top-level design entity 700:

```
--!! [print_group; print_group1] <=   { print1,
                                        print2
                                      };
--!! [print_group; print_group2] <=   { print1,
                                        FXU_inst1.pevent1,
                                        FXU_inst1.pevent2,
                                        FXU_inst2.pevent1,
                                        FXU_inst2.pevent2
                                      };
```

Thus, the declaration of a print event group generally takes the form:

[lhs]<={rhs};

where lhs begins with the keyword print_group to signify the declaration of a print event group and thereafter includes the name of the print event group, and rhs is a comma delimited list of the member print events or print event groups belonging to the print event group.

In a preferred embodiment of the present invention, the declaration of the print events groups can employ wildcarding and bracketed syntax in the rhs to specify member print events or print event groups. For example, the declaration of print event group print_group2 can be simplified through wildcarding utilizing either of the following statements:

```
--!! [print_group; print_group2] <=   { print1,
                                        FXU_inst1.*,
                                        FXU_inst2.*
                                      };
--!! [print_group; print_group2] <=   { print1,
                                        FXU_inst1.pevent*,
                                        FXU_inst2.pevent*
                                      };
``` where the asterisk (i.e., "*") is a wildcard character representing a regular expression. Similarly, wildcarding can simplify the declaration of print event group print_group1, as shown in the following statement:

--!! [print_group; print_group1]={print?};

where the question mark (i.e., "?") indicates a single character wildcard.

Bracketed syntax can also be employed to simplify the enumeration of print events and/or print event groups belonging to a print event group. In bracketed syntax, all instances of an a print event or print event group within all instances of a particular design entity within a given scope can be enumerated with a single identifier enclosed in brackets. For example, if the designer wants to include both instances of pevent1 and both instances of pevent2 within print_group2 as shown in FIG. 7, the following print event group declaration statement can be employed within the HDL file for top-level design entity instance 700:

```
--!! [print_group, print_group2] <=   { print1,
                                        [FXU].pevent*
                                      };
``` where the bracketed term is the name of the design entity in which the print event or print event group of interest occurs. In statements employing bracketed syntax, the default scope of the expression is implied to be the scope of the design entity (in this case top-level design entity instance 700) within which the print event group is instantiated. As will be appreciated, the scope of the identifier specified with bracketed syntax can further be narrowed by explicitly enumerating selected levels of the design hierarchy. For example, the expression "FXU_inst1[a].b" refers only to instantiations of print events or print event groups within FXU_inst1 702a, but does not encompass instantiations of print events or print event groups within FXU_inst2 702b.

It should be appreciated that the regular expressions specified within print event group declaration statements preferably do not support recursive references. Thus, an additional print event group named print_group3 instantiated within top-level design entity instance 700 and having the following print event declaration statement:

--!! [print_group, print_group3]<={*};

would include all the print event groups (i.e., print_group1 and print_group2) and print events (i.e., FXU_inst1.pevent1, FXU_inst1.pevent2, FXU_inst2.pevent1, and FXU_inst2.pevent2) declared within its scope other than print_group3. HDL compiler 462 also further prevents self-referential loops among print groups, where a first print event group includes a second print event group that contains the first print event group. Although recursive references and self-referential loops are preferably not permitted, inclusion of a particular print event or print event group in more than one print event group is permitted.

Referring now to FIG. 8, there is depicted a block diagram of an exemplary print event table 430 corresponding to the simulation model of FIG. 7. As discussed above, print event table 430 is created within instrumentation logic block 420 of a simulation execution model 480 by instrumentation load tool 464 during the process depicted in FIG. 4D.

As shown, print event table 430 includes one or more entries 800, each corresponding to a particular print event or a print event group declared within the simulation model. Each entry 800 of print event table 430 includes a number of fields, including an enable (EN) field 802 indicating whether the associated print event or print event group has been enabled for a particular simulation run, a group/event field 804 indicating whether the entry 800 is for a print event (E) or a print event group (G), an instance field 806 identifying the design entity instance in which the print event or print event group is instantiated (a value of 0 indicates top-level design entity instance 700), a name field 808 indicating the name of the print event or print event group, a message field 810 containing, for print events, the message to be presented in response to an occurrence of the print event, and a variable length pointer field 812 containing one or more pointers. For print events, the first pointer in pointer field 812 identifies the valid signal for the print event, and the second and any subsequent pointer(s), if any, identify the signal or signals for which the value will be reported by the print message. For print event groups, the pointers in pointer field 812 simply point to the print events that are members of the print event group.

Figure 9:
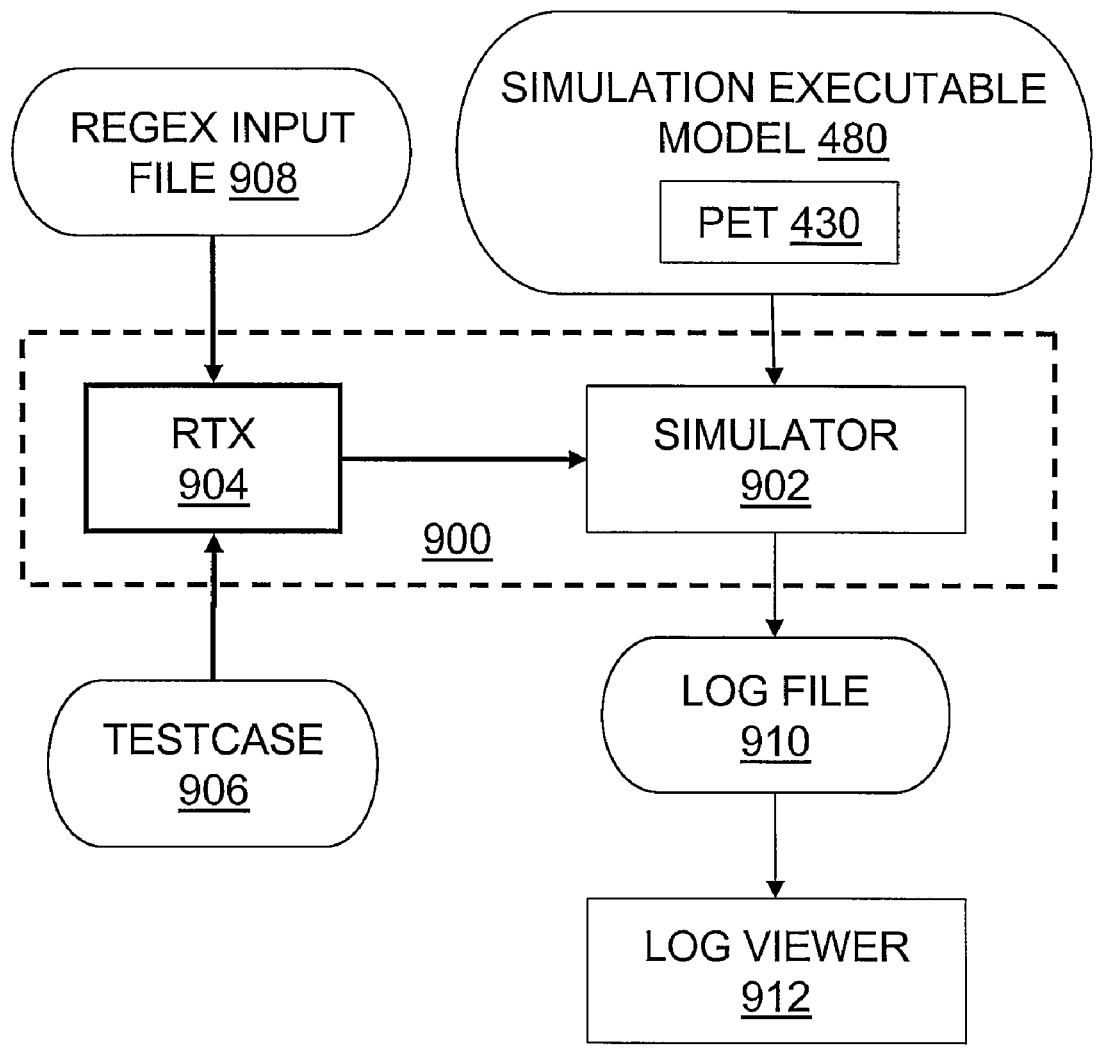
FIG. 9 is a process flow diagram depicting the processing of an instrumented simulation executable model and an associated input files in accordance with the present invention.

With reference now to FIG. 9, there is illustrated a process flow diagram depicting the runtime processing of an instrumented simulation executable model and associated input files in accordance with the present invention. As illustrated, during simulation processing, an instrumented simulation executable model 480, which includes a print event table 430, is passed to a simulation system 900, which in the depicted embodiment includes a simulator 902 and a control program (referred to herein as a RunTime eXecutive (RTX) 904) that governs the operation of simulator 902. Simulation system 900 further receives a testcase 906 specifying values to be applied to simulation executable model 480 and at least one regex (regular expression) input file 908 indicating which print events and print event groups declared within simulation executable model 480 are to be enabled during the simulation run.

In a preferred embodiment, all print events and print event groups are disabled by default. To enable selected print events and print event groups, design and simulation personnel provide one or more regex input files 908 identifying print events and print event groups of interest in the simulation run. In a preferred embodiment, the print events and print event groups of interest are identified by a pair of regular expressions of the form:

design entity instance name, eventname where eventname is a regular expression identifying one or more print events or print event groups of interest and design entity instance name is a regular expression identifying one or more design entity instances in which the print events or print event groups of interest are instantiated. The regular expression pairs within regex input file(s) 908 can further employ wildcarding and bracketed syntax, as discussed above.

In response to receipt of regex input file(s) 908, RTX 904 enables the identified print events and print event groups within print event table 430, as discussed further below. Thereafter, during simulation processing of testcase 906, simulation system 900 presents the print events of interest within log file 910, for example, in statements of the following format:

[design entity instance name, eventname], message where message is the message defined for the print event in print event table 430. It should be noted that a separate set of one or more statements is preferably included in log file 910 for each regex pair included within regex input file(s) 908, even if doing so causes a particular print event to be presented multiple times. Thus, if both print_group1 and print_group2 are enabled for the exemplary simulation executable model of FIG. 7, print event print1 is preferably presented twice within log file 910 to satisfy the different perspectives on the simulation executable model represented by each print event group.

During or after simulation, the contents of log file 910 can be presented for viewing, for example, within display 22 by software such as log viewer 912. Of course, if desired, log file 910 can also be printed in hard copy to facilitate review and analysis of the simulation results. Moreover, log file 910 can be processed with conventional text processing or filtering software to allow a designer to view information about only selected print events or print event groups.

Figure 10:
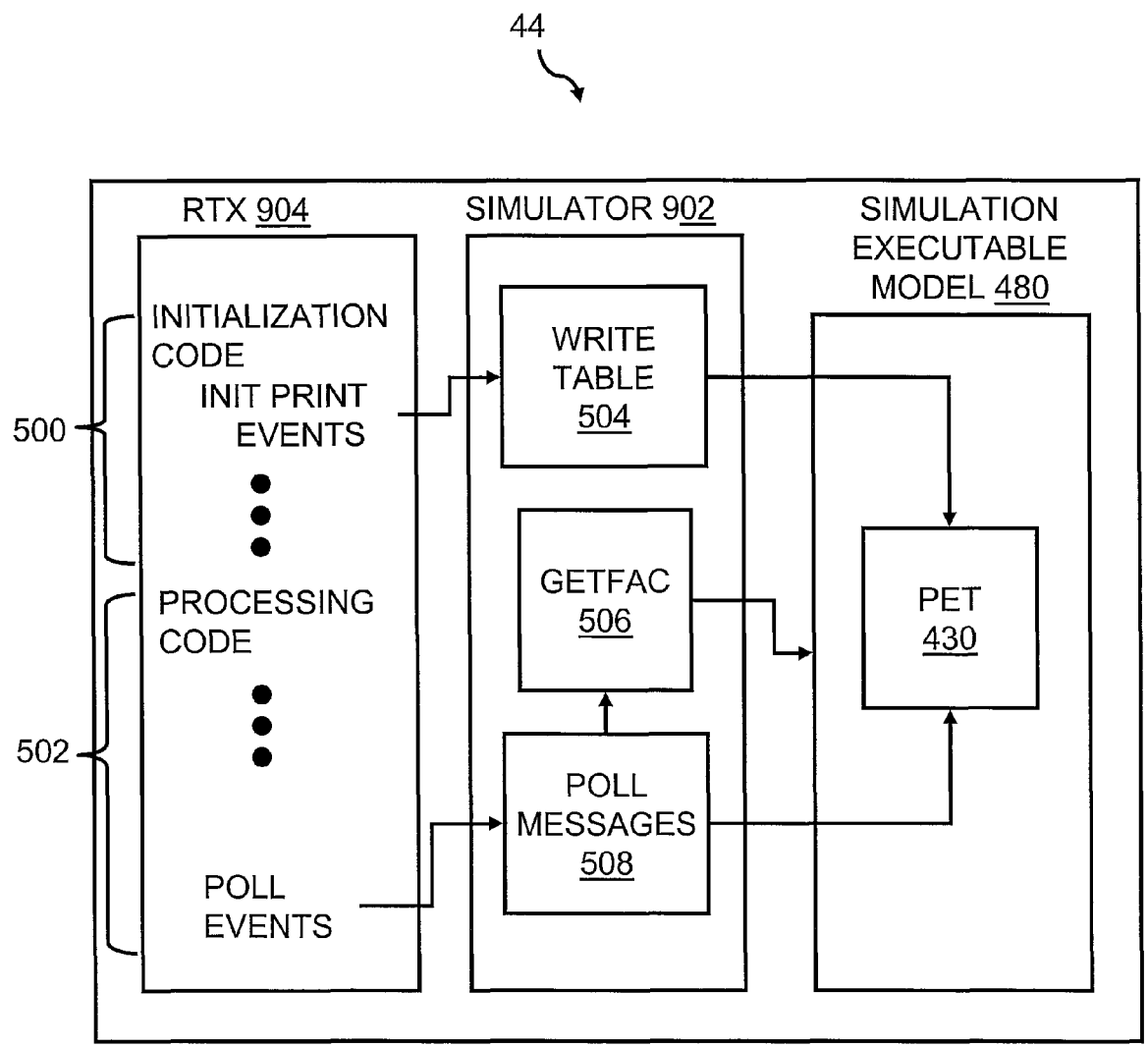
FIG. 10 is an exemplary view of a software simulation environment in accordance with the present invention.

Referring now to FIG. 10, there is depicted an exemplary software simulation environment in accordance with the present invention. As shown, during a simulation run, a simulation executable model 480, a simulator 902 that applies testcase 906 to simulation executable model 480, and an associated RTX 904 that controls operation of simulator 902 reside within main memory 44 of a data processing system 10. RTX 904 includes initialization code 500, which initializes simulator 902 and simulation executable model 480 for proper operation during a simulation run, and processing code 502, which directs simulator 902 to exercise simulation executable model 480 with testcase 906.

As illustrated in FIG. 10, initialization code 500 of RTX 904 includes an Application Program Interface (API) call (e.g., INIT PRINT EVENTS) that is delivered to an API function WRITE TABLE 504 within simulator 902 in order to enable print events and print event groups within print event table 430 of simulation executable model 480 in advance of a simulation run. The processing performed by API function WRITE TABLE 504 is described in greater detail below with reference to FIG. 11. As also shown in FIG. 10, processing code 502 of RTX 904 includes an API call (e.g., POLL EVENTS) that is delivered to an API function POLL MESSAGES 508 within simulator 902 to obtain print event messages, if any, for inclusion by RTX 904 within log file 910. In a typical implementation, the API call POLL EVENTS will be made by RTX 904 at the end of each functional cycle of simulator 902, so that print event messages are presented on a cycle-by-cycle basis. In at least some embodiments, API function POLL MESSAGES 508 may make an additional API function GETFAC 506 within simulator 902 in order to obtain the signal values for presentation within the print event messages. The processing performed by API function POLL MESSAGES 508 is described in greater detail below with reference to FIG. 12.

Figure 11:
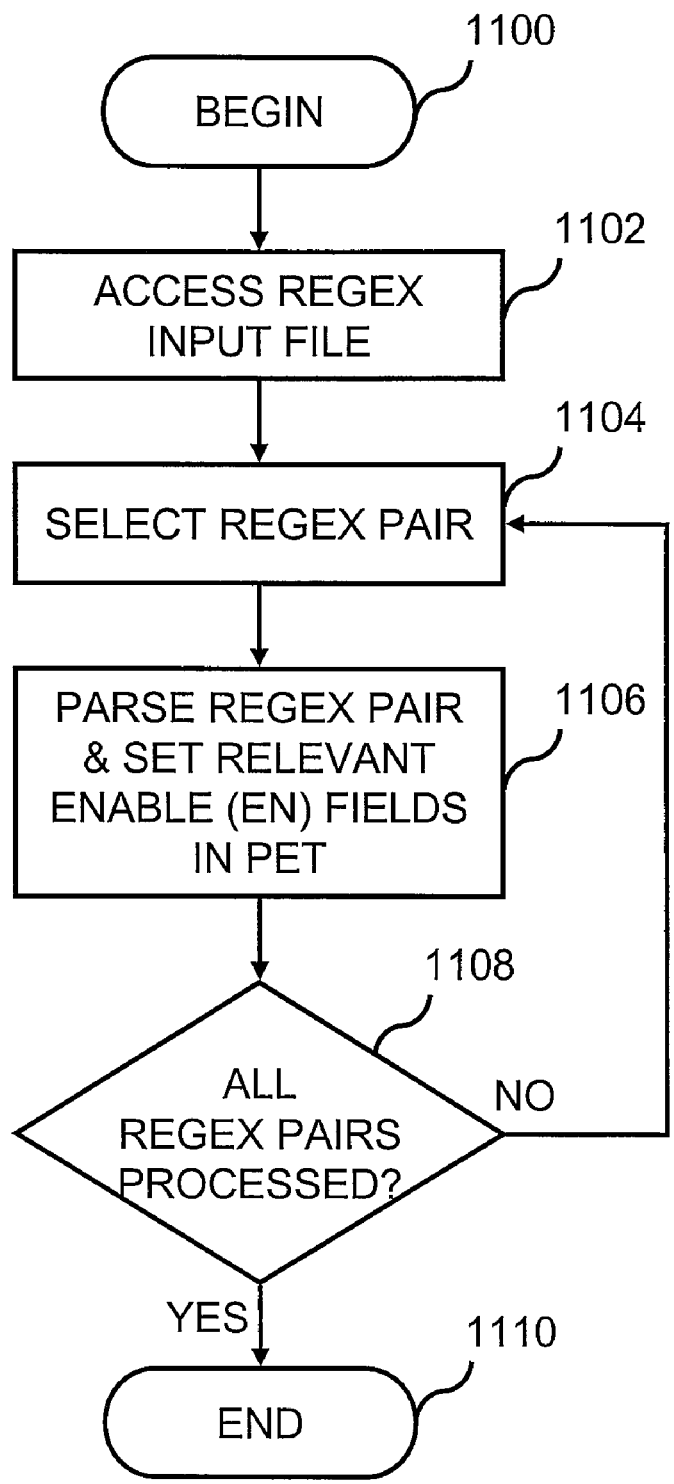
FIG. 11 is a high level logical flowchart of an exemplary process for enabling print events and print event groups in accordance with the present invention.

With reference now to FIG. 11, there is illustrated a high level logical flowchart of an exemplary process for enabling print events and print event groups in accordance with the present invention. As noted above, in an exemplary embodiment the illustrated process is performed by API function WRITE TABLE 504 of simulator 902.

The illustrated process begins at block 1100 in response to receipt by API function WRITE TABLE 504 of an INIT PRINT EVENTS API call from RTX 904 that passes as a parameter a pointer to regex input file 908. In response to receipt of the API call, API function WRITE TABLE 504 accesses the regex input file 908 indicated by the input parameter (block 1102) and selects a regex pair (e.g., design entity instance name, eventname) within regex input file 908 for processing (block 1104).

Following block 1104, the process passes to block 1106, which illustrates API function WRITE TABLE 504 parsing the regex pair selected at block 1104 and setting the enable field 802 in print event table 430 of each entry 800 for which the contents of the instance field 806 and name field 808 satisfy both components of the regex pair. In this manner, user-selected print events and print event groups are enabled for a simulation run within event table 430. At block 1118, API function WRITE TABLE 504 determines whether or not all regex pairs within regex input file 908 have been processed. If not, the process returns to block 1104 and following blocks, which have been described. If, however, API function WRITE TABLE 504 determines at block 1108 that all regex pairs within regex input file 908 have been processed, the process depicted in FIG. 11 terminates at block 1110. The illustrated process may thereafter be repeated for one or more additional regex input file(s) 908.

Figure 12:
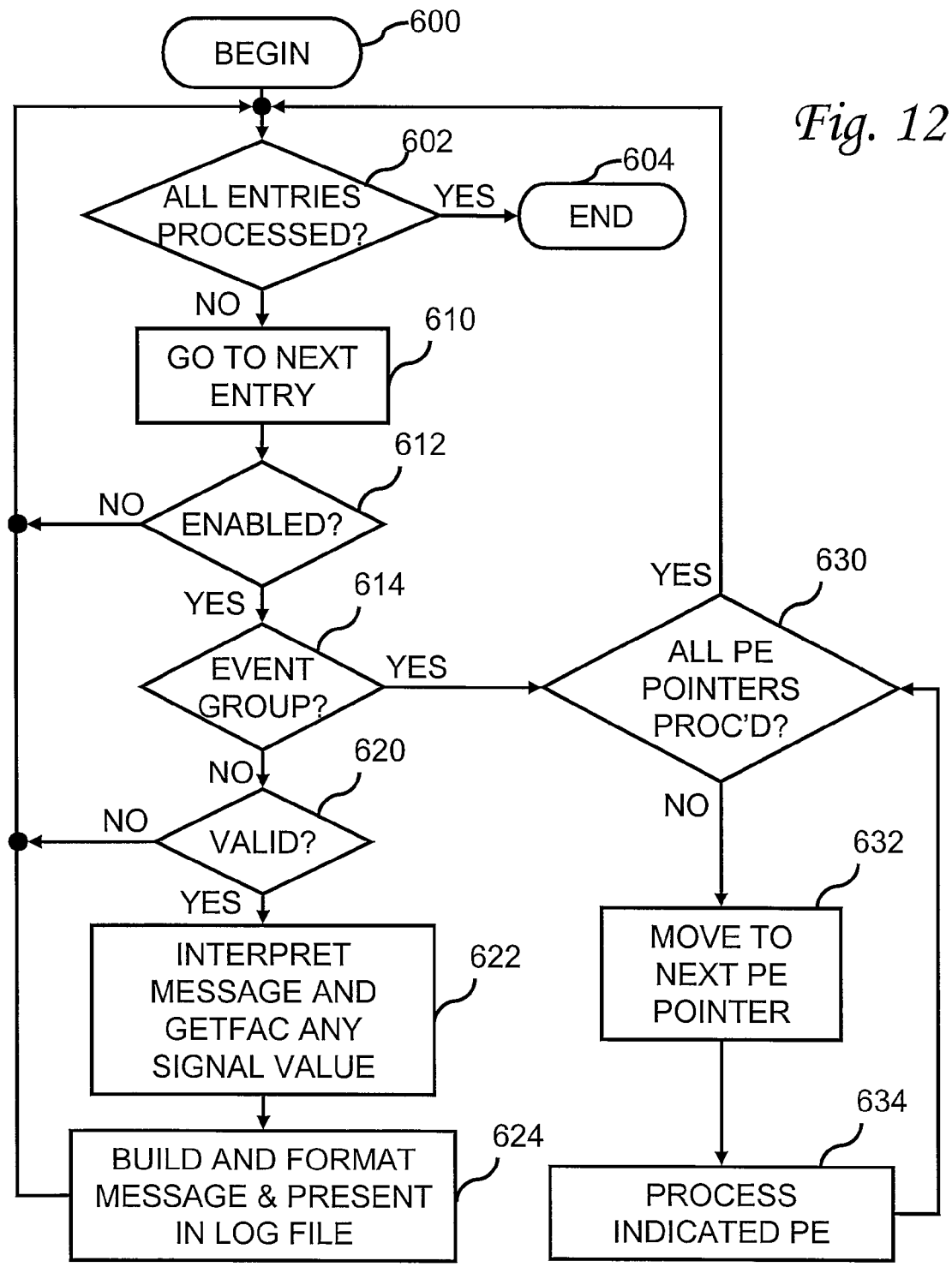
FIG. 12 is a high level logical flowchart of an exemplary process for presenting print events in accordance with the present invention.

Referring now to FIG. 12, there is depicted a high level logical flowchart of an exemplary process for presenting print events in accordance with the present invention. The illustrated process begins at block 600 in response to receipt of a POLL EVENTS API call of RTX 904 by API function POLL MESSAGES 508 of simulator 902. In response to receipt of the POLL EVENTS API call, API function POLL MESSAGES 508 enters a processing loop at block 602 in which it determines whether all entries 800 of print event table 430 have been processed. If so, API function POLL MESSAGES 508 exits the processing loop, and the illustrated process terminates at block 604. If, however, API function POLL MESSAGES 508 determines at block 602 that all entries 800 in print event table 430 have not been processed, the process proceeds to block 610, which illustrates API function POLL MESSAGES 508 accessing a next entry 800 in print event table 430.

Next, at block 612, API function POLL MESSAGES 508 determines whether the print event or print event group associated with the selected entry 800 is enabled. If not, processing of the selected entry 800 of print event table 430 ends, and the process returns to block 602, which has been described. If, however, the selected entry 430 of print event table 430 is enabled, API function POLL MESSAGES 508 further determines at block 614 whether the selected entry 800 corresponds to a print event group or an individual print event by examining group/event field 804. If the selected entry 800 represents a print event group, the process passes to block 630, which is described below. If, on the other hand, the selected entry 800 represents an individual print event, API function POLL MESSAGES 508 determines at block 620 whether the valid signal identified by the first pointer of pointer field 812 is asserted. In the depicted embodiment, API function POLL MESSAGES 508 determines the state of the valid signal by issuing a call to API function GETFAC 506, which obtains the valid signal value from simulation executable model 480 and returns it to API function POLL MESSAGES 508. In response to a determination at block 620 that the valid signal is not asserted, processing of the selected entry 800 of print event table 430 ends, and the process returns to block 602, which has been described. If, however, the valid signal is asserted, the process passes to block 622.

Block 622 depicts API function POLL MESSAGES 508 interpreting the message contained in message field 810 of the selected entry 800 and issuing a call to API function GETFAC 506 to obtain a signal value, if any, from simulation executable model 480 for presentation within the message. API function POLL MESSAGES 508 then builds the print event message with the signal value, if any, in the format specified by the formatting information for the message and presents the message in log file 910. Thereafter, the process returns to block 602, which has been described.

Referring now to block 630, if the selected entry 800 of print event table 430 represents a print event group, API function POLL MESSAGES 508 enters a second processing loop in which all print events that are members of the print event group are processed via the print event pointers in pointer field 812 of the selected entry 800. Thus, if API function POLL MESSAGES 508 determines at block 630 that fewer than all print event pointers in pointer field 812 of the selected entry 800 have been processed, API function POLL MESSAGES 508 accesses the next such print event pointer at block 632 and processes its entry 800 in print event table 430 at block 634. That is, at block 634, API function POLL MESSAGES 508 performs each of the steps illustrated at block 620-624 for the print event's entry 800. Following such processing, the process returns to block 630. Once all print event pointers have been processed, API function POLL MESSAGES 508 exits the second processing loop and returns to block 602, which has been described.

As has been described, the present invention provides a method, system and program product supporting the presentation of print events in a simulation system. According to the present invention, print events and print event groups can be specified by designers in the HDL source code files defining a digital design and/or HDL source code files defining simulation instrumentation for the digital design. The print events and print event groups can then be selectively enabled and disabled for particular simulation runs to facilitate the analysis and debugging of the digital design.

While the invention has been particularly shown as described with reference to a preferred embodiment, it will be understood by those skilled in the art that various changes in form and detail may be made therein without departing from the spirit and scope of the invention. For example, although the present invention has been described with reference to an exemplary embodiment in which the data structure within the simulation executable model that associates print events with valid and functional signals in the simulation executable model is described as a print event table, those skilled in the art will appreciate that one or more data structures may be employed and that such data structure(s) can be implemented utilizing well-known or future developed data structure(s) other than a table (e.g., linked list, tree, etc.). In addition, one of the embodiments of the invention can be implemented as program code resident in random access memory 28 of one or more computer systems configured generally as described in FIG. 1 and FIG. 2. Until required by computer system 10, the program code may be stored in another computer readable storage device, such as disk drive 33 or in a removable storage device such as an optical disk for eventual use in a CD-ROM drive or a floppy disk for eventual use in a floppy disk drive. Such program code resident within a computer readable medium be referred to as program product. Further, the program code can be stored in the memory of another computer and transmitted over a local area network or a wide area network, such as the Internet, when desired by the user.

What is claimed is:

1. A method of simulation processing in a data processing system, said method comprising:

receiving one or more HDL source files describing a digital design including a plurality of hierarchically arranged design entities, the one or more HDL source files including one or more statements describing a plurality of print events within the plurality of hierarchically arranged design entities, wherein the one or more statements specify, for each of the plurality of print events:

an associated message to be conditionally presented in conjunction with results of simulation of the digital design if the print event occurs within a target design entity among the plurality of hierarchically arranged design entities during simulation of the digital design, wherein the associated message has formatting information describing a presentation format of a value of the functional signal; and instrumentation logic to detect a condition of at least one associated signal in the digital design during simulation of the digital design, and responsive thereto, to generate an occurrence of the print event within the target design entity during the simulation; and processing the one or more HDL source files to obtain a simulation executable model, wherein for a particular print event among the plurality of print events, the at least one associated signal includes a functional signal within the simulation executable model and a valid signal in the simulation executable model that is asserted for an occurrence of an associated print event to occur, and wherein the associated message of the particular print event references the functional signal but not the valid signal, wherein the processing includes:

instantiating in the simulation executable model one or more instances of each of the plurality of hierarchically arranged design entities in accordance with a hierarchical arrangement described by the one or more HDL source files;

instantiating within each instance of each target design entity the instrumentation logic specified by the one or more statements describing the plurality of print events; and building within the simulation executable model a data structure describing the plurality of print events defined for the simulation executable model and associating each of the plurality of print events with its respective associated message, wherein the data structure contains the associated message and its formatting information.

2. A method of simulation processing in a data processing system, said method comprising:

receiving one or more HDL source files describing a digital design including a plurality of hierarchically arranged design entities, the one or more HDL source files including one or more statements describing a plurality of print events within the plurality of hierarchically arranged design entities, wherein the one or more statements specify, for each of the plurality of print events:

an associated message to be conditionally presented in conjunction with results of simulation of the digital design if the print event occurs within a target design entity among the plurality of hierarchically arranged design entities during simulation of the digital design; and instrumentation logic to detect a condition of at least one associated signal in the digital design during simulation of the digital design, and responsive thereto, to generate an occurrence of the print event within the target design entity during the simulation; and processing the one or more HDL source files to obtain a simulation executable model, wherein the processing includes:

instantiating in the simulation executable model one or more instances of each of the plurality of hierarchically arranged design entities in accordance with a hierarchical arrangement described by the one or more HDL source files;

instantiating within each instance of each target design entity the instrumentation logic specified by the one or more statements describing the plurality of print events;

building within the simulation executable model a data structure describing the plurality of print events defined for the simulation executable model and associating each of the plurality of print events with its respective associated message;

in response to receiving input identifying selected ones of the plurality of print events to enable for a simulation run, updating the data structure in the simulation executable model to identify which of the plurality of print events are enabled for the simulation run;

simulating the digital design by applying a testcase to the simulation executable model; and automatically conditionally presenting the associated message for a given print event among the plurality of print events only if that given print event is enabled for the simulation run and if an occurrence of that print event is detected during the simulation run.

3. The method of claim 2, wherein presenting the associated message comprises presenting the associated message in a log file.

4. The method of claim 2, wherein:

said receiving includes receiving in the one or more HDL source files a statement instantiating within one of the plurality of design entities a print event group having multiple print events of the plurality of print events as members;

said building a data structure includes building a data structure associating the multiple print events that are members of the print event group with the print event group; and in response to receiving input identifying the print event group for enablement during a simulation run, updating the data structure in the simulation executable model to identify the multiple print events as enabled for the simulation run.

5. A data processing system, comprising:

a processing unit;

data storage coupled to the processing unit; and model build program code in the data storage and executable by the processing unit to generate a simulation executable model, wherein the model build program code receives one or more HDL source files describing a digital design including a plurality of hierarchically arranged design entities, the one or more HDL source files including one or more statements describing a plurality of print events within the plurality of hierarchically arranged design entities, wherein the one or more statements specify, for each of the plurality of print events:

an associated message to be conditionally presented in conjunction with results of simulation of the digital design if the print event occurs within a target design entity among the plurality of hierarchically arranged design entities during simulation of the digital design, wherein the associated message has formatting information describing a presentation format of a value of the functional signal; and instrumentation logic to detect a condition of at least one associated signal in the digital design during simulation of the digital design, and responsive thereto, to generate an occurrence of the print event within the target design entity during the simulation; and wherein the model build code processes the one or more HDL source files to obtain a simulation executable model including:

one or more instances of each of the plurality of hierarchically arranged design entities in accordance with a hierarchical arrangement described by the one or more HDL source files;

the instrumentation logic within each instance of each target design entity specified by the one or more statements describing the plurality of print events, wherein for a particular print event among the plurality of print events, the at least one associated signal includes a functional signal within the simulation executable model and a valid signal in the simulation executable model that is asserted for an occurrence of an associated print event to occur, and wherein the associated message of the particular print event references the functional signal but not the valid signal; and a data structure describing the plurality of print events defined for the simulation executable model and associating each of the plurality of print events with its respective associated message, wherein the data structure contains the associated message and its formatting information.

6. A program product, comprising:

a tangible computer readable medium; and model build program code within the computer readable medium and executable by a data processing system to generate a simulation executable model, wherein the model build program code receives one or more HDL source files describing a digital design including a plurality of hierarchically arranged design entities, the one or more HDL source files including one or more statements describing a plurality of print events within the plurality of hierarchically arranged design entities, wherein the one or more statements specify, for each of the plurality of print events:

an associated message to be conditionally presented in conjunction with results of simulation of the digital design if the print event occurs within a target design entity among the plurality of hierarchically arranged design entities during simulation of the digital design, wherein the associated message has formatting information describing a presentation format of a value of the functional signal; and instrumentation logic to detect a condition of at least one associated signal in the digital design during simulation of the digital design, and responsive thereto, to generate an occurrence of the print event within the target design entity during the simulation, wherein for a particular print event among the plurality of print events, the at least one associated signal includes a functional signal within the simulation executable model and a valid signal in the simulation executable model that is asserted for an occurrence of an associated print event to occur, and wherein the associated message of the particular print event references the functional signal but not the valid signal; and wherein the model build code processes the one or more HDL source files to obtain a simulation executable model including:

one or more instances of each of the plurality of hierarchically arranged design entities in accordance with a hierarchical arrangement described by the one or more HDL source files;

the instrumentation logic within each instance of each target design entity specified by the one or more statements describing the plurality of print events; and a data structure describing the plurality of print events defined for the simulation executable model and associating each of the plurality of print events with its respective associated message, wherein the data structure contains the associated message and its formatting information.

* * * * *